US010182134B2

(12) United States Patent
Lim et al.

(10) Patent No.: US 10,182,134 B2
(45) Date of Patent: Jan. 15, 2019

(54) ELECTRONIC DEVICE INCLUDING COMPONENT MOUNTING STRUCTURE THROUGH BENDED DISPLAY

(71) Applicant: Samsung Electronics Co., Ltd., Gyeonggi-do (KR)

(72) Inventors: Jin-Ho Lim, Seoul (KR); Yong-Hwa Kim, Gyeonggi-do (KR); Sangyong Eom, Gyeonggi-do (KR); Song Hee Jung, Gyeonggi-do (KR); Gyun Heo, Gyeonggi-do (KR); Dong-Il Son, Gyeonggi-do (KR); Byounguk Yoon, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/852,951

(22) Filed: Dec. 22, 2017

(65) Prior Publication Data

US 2018/0183912 A1    Jun. 28, 2018

(30) Foreign Application Priority Data

Dec. 22, 2016    (KR) ........................ 10-2016-0176610

(51) Int. Cl.
*H04M 1/02*    (2006.01)
*G06F 1/16*    (2006.01)
(Continued)

(52) U.S. Cl.
CPC ........ *H04M 1/0268* (2013.01); *G06F 1/1626* (2013.01); *G06F 1/1652* (2013.01);
(Continued)

(58) Field of Classification Search
CPC .... G06F 1/1626; G06F 1/1652; G06F 1/1684; H03K 17/962; H03K 17/964;
(Continued)

(56) References Cited

U.S. PATENT DOCUMENTS 4,328,399 A * 5/1982 Perks ...................... H04M 1/23
174/261
6,156,985 A * 12/2000 Chiang .................. H01H 3/125
200/344
(Continued)

FOREIGN PATENT DOCUMENTS

EP          3 079 033       10/2016
KR     10-2015-0136934     12/2015
(Continued)

OTHER PUBLICATIONS

European Search Report dated May 3, 2018 issued in counterpart application No. 17209730.5-1216, 6 pages.

*Primary Examiner* — Hai V Nguyen
(74) *Attorney, Agent, or Firm* — The Farrell Law Firm, P.C.

(57) ABSTRACT

An electronic device and its operating method are provided. The electronic device includes a housing including a first surface, a second surface facing the first surface in a spaced apart manner, and a lateral surface surrounding a space between the first surface and the second surface, a display mounted to the housing and including a flat area substantially corresponding to the first surface and a bending area extended from the flat area in a direction of the lateral surface, a filler disposed between the housing and the bending area of the display, at least one electronic component which is installed to the filler and of which one part is exposed to the outside by penetrating at least one region of the bending area of the display, a detection circuit disposed inside the housing and electrically connected to the electronic component to detect an operation of the electronic component, and at least one processor operatively coupled to the detection circuit and the display to provide control to
(Continued)

perform a corresponding function of the electronic device on the basis of a provided detection signal.

20 Claims, 35 Drawing Sheets

(51) Int. Cl.
    *H04M 1/23*     (2006.01)
    *H03K 17/96*     (2006.01)

(52) U.S. Cl.
    CPC .......... *G06F 1/1656* (2013.01); *G06F 1/1684* (2013.01); *H03K 17/962* (2013.01); *H03K 17/964* (2013.01); *H04M 1/0266* (2013.01); *H04M 1/236* (2013.01); *H04M 1/0202* (2013.01); *H04M 2250/22* (2013.01)

(58) Field of Classification Search
    CPC .. H04M 1/0268; H04M 1/0266; H04M 1/236; H04M 1/0202; H04M 2250/22
    USPC ...................................... 455/566; 361/679.01
    See application file for complete search history.

(56) References Cited

U.S. PATENT DOCUMENTS

| | | | | |
|---|---|---|---|---|
| 6,669,600 | B2* | 12/2003 | Warner | A63B 24/0021 482/4 |
| 6,839,670 | B1* | 1/2005 | Stammler | G10L 15/063 704/251 |
| 7,623,159 | B2* | 11/2009 | Wada | G03B 17/00 348/205 |
| 7,902,989 | B2* | 3/2011 | Cox | G01F 23/2921 250/901 |
| 8,005,516 | B2* | 8/2011 | Ohki | H04M 1/0247 455/550.1 |
| 8,119,048 | B2* | 2/2012 | Nishimura | B29C 45/14073 264/252 |
| 8,521,218 | B2* | 8/2013 | Dhaliwal | H04W 4/08 455/550.1 |
| 8,614,881 | B2* | 12/2013 | Yoo | G04G 21/00 345/169 |
| 9,029,191 | B2* | 5/2015 | Yamazaki | H01L 27/1225 438/104 |
| 9,261,721 | B2* | 2/2016 | Kuk | G02F 1/133308 |
| 9,276,055 | B1* | 3/2016 | Son | H01L 27/3276 |
| 9,356,087 | B1* | 5/2016 | Lee | H01L 27/3276 |
| 9,389,688 | B2* | 7/2016 | Tossavainen | G06F 3/016 |
| 9,411,451 | B2* | 8/2016 | Myers | H04M 1/0268 |
| 9,475,431 | B2* | 10/2016 | Brummel | B60R 1/04 |
| 9,578,149 | B2* | 2/2017 | Moon | H04M 1/0202 |
| 9,778,710 | B2* | 10/2017 | Kim | H04B 1/036 |
| 9,836,270 | B2* | 12/2017 | Yliaho | H04R 3/005 |
| 9,939,844 | B2* | 4/2018 | Choi | G06F 1/1643 |
| 9,977,466 | B2* | 5/2018 | Kwon | G06F 1/1652 |
| 10,031,392 | B2* | 7/2018 | Nakada | G02F 1/136286 |
| 10,051,096 | B2* | 8/2018 | Baek | H04M 1/0262 |
| 2006/0033818 | A1* | 2/2006 | Wada | G03B 17/00 348/208.11 |
| 2007/0035524 | A1* | 2/2007 | Hyatt | G06F 1/1626 345/173 |
| 2008/0045279 | A1* | 2/2008 | Ohki | H04M 1/0247 455/575.1 |
| 2010/0014232 | A1* | 1/2010 | Nishimura | B29C 45/14073 361/679.3 |
| 2010/0078303 | A1* | 4/2010 | Larsen | H01H 13/705 200/5 A |
| 2010/0226084 | A1* | 9/2010 | Chen | G06F 1/1626 361/679.08 |
| 2011/0228494 | A1* | 9/2011 | Xiao | H01H 13/705 361/752 |
| 2012/0050962 | A1* | 3/2012 | Hsiung | H01H 13/705 361/679.01 |
| 2013/0088884 | A1* | 4/2013 | Brummel | B60R 1/04 362/494 |
| 2013/0250502 | A1* | 9/2013 | Tossavainen | G06F 3/016 361/679.01 |
| 2013/0279088 | A1* | 10/2013 | Raff | G06F 1/1637 361/679.01 |
| 2014/0071056 | A1* | 3/2014 | Liu | G06F 1/1626 345/169 |
| 2014/0145836 | A1* | 5/2014 | Tossavainen | G06F 3/016 340/407.2 |
| 2014/0241558 | A1* | 8/2014 | Yliaho | H04R 5/02 381/333 |
| 2015/0007501 | A1* | 1/2015 | Liang | H04M 1/18 49/463 |
| 2015/0122688 | A1* | 5/2015 | Dias | A47G 19/025 206/459.1 |
| 2015/0160699 | A1* | 6/2015 | Choi | G06F 1/1643 345/173 |
| 2015/0178038 | A1* | 6/2015 | Yliaho | H04R 3/005 455/566 |
| 2015/0245514 | A1* | 8/2015 | Choung | G06K 9/00053 361/749 |
| 2015/0342525 | A1* | 12/2015 | Justice | A61B 5/6831 600/479 |
| 2016/0014390 | A1* | 1/2016 | Ligtenberg | G06F 1/1601 348/46 |
| 2016/0132119 | A1* | 5/2016 | Temple | G06F 3/017 345/168 |
| 2016/0233037 | A1* | 8/2016 | Lee | H01H 13/705 |
| 2016/0234361 | A1* | 8/2016 | Baek | H04M 1/0262 |
| 2016/0234362 | A1* | 8/2016 | Moon | H04M 1/0202 |
| 2016/0313773 | A1* | 10/2016 | Kim | H04B 1/036 |
| 2016/0372717 | A1* | 12/2016 | Noda | H01M 2/026 |
| 2017/0036603 | A1* | 2/2017 | Brummel | B60R 1/04 |
| 2017/0102598 | A1* | 4/2017 | Nakada | G02F 1/136286 |
| 2017/0153695 | A1* | 6/2017 | Kawashima | G06F 1/1643 |
| 2017/0168711 | A1* | 6/2017 | Temple | G06F 3/0233 |
| 2017/0213068 | A1* | 7/2017 | Chang | G06K 9/00053 |
| 2017/0243705 | A1* | 8/2017 | Bae | G07C 9/00563 |
| 2017/0365239 | A1* | 12/2017 | Peterson | G10D 3/12 |
| 2018/0017999 | A1* | 1/2018 | Kim | G06F 1/1601 |
| 2018/0081399 | A1* | 3/2018 | Kwon | G06F 1/1652 |
| 2018/0084680 | A1* | 3/2018 | Jarvis | G06F 3/0412 |
| 2018/0097197 | A1* | 4/2018 | Han | H01L 51/0097 |

FOREIGN PATENT DOCUMENTS

| | | |
|---|---|---|
| KR | 10-1587139 | 2/2016 |
| KR | 10-1650383 | 8/2016 |
| WO | WO 2013/048881 | 4/2013 |

* cited by examiner

ELECTRONIC DEVICE INCLUDING COMPONENT MOUNTING STRUCTURE THROUGH BENDED DISPLAY

PRIORITY

This application claims priority under 35 U.S.C. § 119(a) to a Korean Patent Application filed in the Korean Intellectual Property Office on Dec. 22, 2016, and assigned Serial No. 10-2016-0176610, the entire content of which is incorporated hereby by reference.

BACKGROUND

1. Field of the Disclosure

The present disclosure relates to an electronic device having an electronic component mounting structure through a bending area of a bended display.

2. Description of the Related Art

Portable electronic devices, in particular, electronic devices represented as smart phones, have been progressively developed and thus a hardware/software gap has been gradually reduced for each manufacturer. As a result, there is a tendency that the electronic device is improved not only in a performance aspect but also in feeling of use or in a design aspect.

The electronic device includes a display, and the display may include a flat-type display and/or a bended display having a bended surface in at least one region thereof. Such a bended display can provide a differentiated user experience and excellent feeling of aesthetics, and can help to improve feeling of grip on the electronic device.

SUMMARY

An aspect of the present disclosure provides a bended display applied to an electronic device which includes a bending area extending from a front region of the electronic device to one part of a lateral surface or to one part of a rear surface through the lateral surface.

According to an aspect of the present disclosure, a software-related button (e.g., a touch button, a button based on a pressure sensor, or the like) is provided at a corresponding location.

According to an aspect of the present disclosure, an electronic device having a component mounting structure through a bended display is provided.

According to an aspect of the present disclosure, an electronic device is provided, having a component mounting structure through a bended display configured to enhance convenience of use while providing excellent feeling of aesthetics and feeling of grip.

According to an aspect of the present disclosure, an electronic device having a component mounting structure through a bended display with an improved assembling property is provided.

In accordance with an aspect of the present disclosure, an electronic device includes a housing including a first surface, a second surface facing the first surface in a spaced apart manner, and a lateral surface surrounding a space between the first surface and the second surface, a display mounted to the housing and including a flat area substantially corresponding to the first surface and a bending area extended from the flat area in a direction of the lateral surface, a filler disposed between the housing and the bending area of the display, at least one electronic component which is installed to the filler and of which one part is exposed to the outside by penetrating at least one region of the bending area of the display, a detection circuit disposed inside the housing and electrically connected to the electronic component to detect an operation of the electronic component, and at least one processor operatively coupled to the detection circuit and the display to provide control to perform a corresponding function of the electronic device on the basis of a provided detection signal.

In accordance with an aspect of the present disclosure, an electronic device includes a housing including a first surface, a second surface facing the first surface in a spaced apart manner, and a lateral surface surrounding a space between the first surface and the second surface, a display mounted to the housing and including a flat area substantially corresponding to the first surface and a bending area extended from the flat area in a direction of the lateral surface, a filler disposed between the housing and the bending area of the display, a key button assembly which is installed to the filler and of which one part is exposed to the outside by penetrating at least one region of the bending area of the display, a detection circuit disposed inside the housing and electrically connected to the key button assembly to detect a key input, and at least one processor operatively coupled to the detection circuit and the display to provide control to perform a corresponding function of the electronic device on the basis of a provided detection signal.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION OF EMBODIMENTS OF THE PRESENT DISCLOSURE

Figure 1:
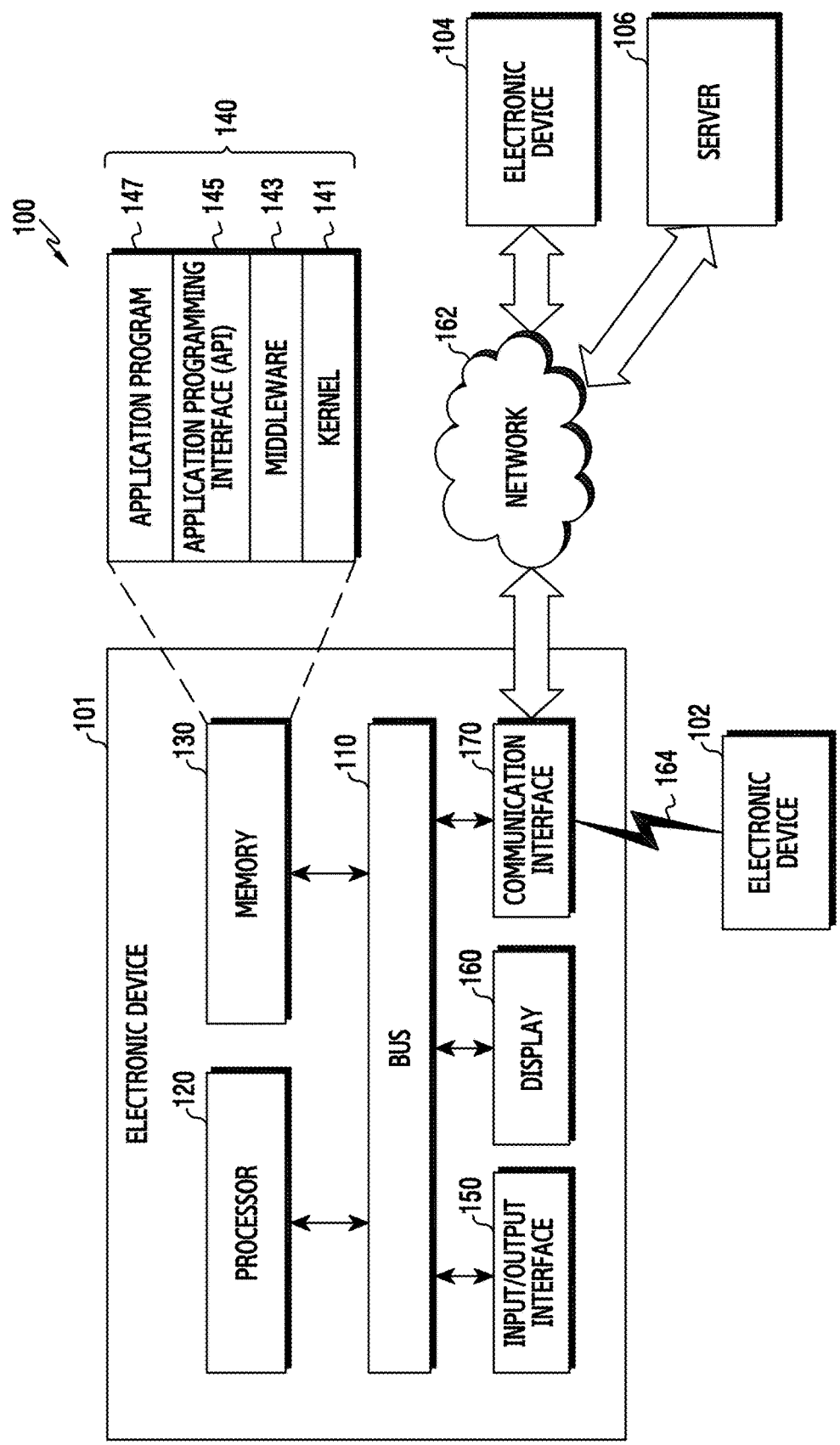
FIG. 1 illustrates a network environment including an electronic device according to embodiments of the present disclosure.

Embodiments of the present disclosure will now be described in greater detail with reference to the accompanying drawings, in which similar reference numerals may be used to refer to similar elements. In the following disclosure, specific details such as detailed configuration and components are merely provided to assist the overall understanding of these example embodiments of the present disclosure. Therefore, it should be apparent to those skilled in the art that various changes and modifications of the embodiments described herein can be made without departing from the scope and spirit of the present disclosure. For example, those skilled in the art will understand that the principles of the present disclosure may be implemented in any suitably arranged electronic device.

In addition, descriptions of well-known functions and constructions may be omitted for clarity and conciseness.

The terms and words used in the following description and claims are not limited to their dictionary meanings, but are used to convey a clear and consistent understanding of the present disclosure. Accordingly, it should be apparent to those skilled in the art that the following description of embodiments of the present disclosure is provided for illustrative purposes only and not for the purpose of limiting the present disclosure, as defined by the appended claims and their equivalents.

Singular terms such as "a," "an," and "the" include plural references unless the context clearly dictates otherwise. Thus, for example, "a component surface" includes reference to one or more of such surfaces.

Herein, terms such as "have," "may have," "include," and "may include" refer to the presence of corresponding features (e.g., elements such as numerical values, functions, operations, or parts), but do not preclude the presence of additional features.

The terms "A or B," "at least one of A or/and B," and "one or more of A or/and B" include all possible combinations of the enumerated items. For example, "A or B," "at least one of A and B," or "at least one of A or B" means (1) at least one A, (2) at least one B, or (3) at least one A and at least one B.

Numerical terms, such as "first" and "second", may modify various elements regardless of an order and/or importance of the elements, and do not limit the elements. These terms may be used for the purpose of distinguishing one element from another element. For example, a first user device and a second user device may indicate different user devices, regardless of the order or importance the devices. Accordingly, a first element may be referred to as a second element, and similarly, a second element may be referred to as a first element, without departing from the scope the present disclosure.

When an element (e.g., a first element) is "(operatively or communicatively) coupled with/to" or "connected to" another element (e.g., a second element), the first element may be directly "coupled with/to" the second element, or there may be an intervening element (e.g., a third element) between the first element and the second element. However, when the first element is "directly coupled with/to" or "directly connected to" the second element, there is no intervening element therebetween.

Herein, the term "module" may refer to a unit including one of hardware, software, and firmware, or any combination thereof. The term "module" may be interchangeably used with terms, such as unit, logic, logical block, component, and circuit. A module may be a minimum unit of an integrally constituted component or may be a part thereof. A module may be a minimum unit for performing one or more functions or may be a part thereof. A module may be mechanically or electrically implemented. For example, a module may include at least one of a dedicated processor, a central processing unit (CPU), an application-specific integrated circuit (ASIC) chip, a field-programmable gate array (FPGA), and a programmable-logic device, which are known or will be developed and which perform certain operations.

All of the terms used herein, including technical or scientific terms, have the same meanings as those generally understood by a person having ordinary skill in the related art unless they are defined otherwise. Terms defined in a generally used dictionary should be interpreted as having the same or similar meanings as the contextual meanings of the relevant technology and should not be interpreted as having ideal or exaggerated meanings unless clearly defined as such herein. Even terms defined in the disclosure should not be interpreted as excluding embodiments of the present disclosure.

Example electronic devices may include smart phones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, and/or wearable devices, or the like, but are not limited thereto. For example, the wearable devices may include accessory-type wearable devices (e.g., watches, rings, bracelets, anklets, necklaces, glasses, contact lenses, or head-mounted-devices (HMDs)), fabric or clothing integral wearable devices (e.g., electronic clothes), body-mounted wearable devices (e.g., skin pads or tattoos), and/or implantable wearable devices (e.g., implantable circuits), or the like but are not limited thereto.

The electronic devices may include smart home appliances, such as televisions (TVs), digital versatile disk (DVD) players, audio players, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ and PlayStation™), electronic dictionaries, electronic keys, camcorders, and/or electronic picture frames, or the like, but are not limited thereto.

The electronic devices may include a medical device, such as a portable medical measurement device (e.g., a blood glucose meter, a heart rate monitor, a blood pressure monitor, or a thermometer), a magnetic resonance angiography (MRA) device, a magnetic resonance imaging (MRI) device, a computed tomography (CT) device, a scanner, an ultrasonic device, a navigation device, a GPS receiver, an event data recorder (EDR), a flight data recorder (FDR), a vehicle infotainment device, electronic equipment for a vessel (e.g., navigation systems, gyrocompasses, etc.), an avionic device, a security device, a head unit for a vehicle, an industrial or home robot, an automatic teller machine (ATM), a point of sale (POS) device, and/or an Internet of Things (IoT) device (e.g., a light bulb, sensor, electric or gas meter, sprinkler device, fire alarm, thermostat, street lamp, toaster, exercise equipment, hot water tank, heater, or boiler).

The electronic device may also include a part of furniture or building/structure, electronic board, electronic signature receiving device, projector, or measuring instrument (e.g., water meter, electricity meter, gas meter, or wave meter).

The electronic device may be a flexible electronic device.

The electronic device may be a combination of the above-described devices.

Additionally, the electronic device of the present disclosure is not limited to the above-described devices, and may include a new electronic device according to the development of new technologies.

Herein, the term "user" may refer to a person who uses an electronic device or may refer to a device (e.g., an artificial intelligence (AI) electronic device) which uses an electronic device.

FIG. 1 is a diagram illustrating an example network environment including an electronic device, according to an embodiment of the present disclosure.

Referring to FIG. 1, the network environment includes an electronic device 101, which includes a bus 110, a processor (e.g., including processing circuitry) 120, a memory 130, an input/output interface (e.g., including input/output circuitry) 150, a display 160, and a communication interface (e.g., including communication circuitry) 170. Alternatively, the electronic device 101 may omit at least one of the illustrated components and/or include additional components.

The bus 110 is a circuit for connecting the components 120 through 170 and delivering communications such as a control message therebetween.

The processor 120 may include various processing circuitry, such as at least one of a dedicated processor, a CPU, an application processor (AP), and/or a communication processor (CP). The processor 120 processes an operation or data on control of and/or communication with another component of the electronic device 101.

The processor 120 may also include a microprocessor or any suitable type of processing circuitry, such as one or more general-purpose processors (e.g., ARM-based processors), a digital signal processor (DSP), a programmable logic device (PLD), an ASIC, a field-programmable gate array (FPGA), a graphical processing unit (GPU), a video card controller, etc. In addition, when a general purpose computer accesses code for implementing the processing shown herein, the execution of the code transforms the general purpose computer into a special purpose computer for executing the processing shown herein.

The processor 120, which can be connected to an LTE network, may determine whether a call is connected over a circuit switched (CS) service network using caller identification information, such as a caller phone number of the CS service network, e.g., a 2G or a 3rd generation (3G) network. For example, the processor 120 receives incoming call information, such as a CS notification message or a paging request message of the CS service network over the LTE network, such as circuit-switched fallback (CSFB). The processor 120 being connected to the LTE network receives incoming call information, such as a paging request message over the CS service network, such as single radio LTE (SRLTE).

When receiving an incoming CS notification message or a paging request message of the CS service network over the LTE network, the processor 120 may obtain caller identification information from the incoming call information. The processor 120 may display the caller identification information on the display 160. The processor 120 may determine whether to connect the call based on input information corresponding to the caller identification information displayed on the display 160. For example, when detecting input information corresponding to an incoming call rejection, through the input/output interface 150, the processor 120 may restrict the voice call connection and maintain the LTE network connection. When detecting input information corresponding to an incoming call acceptance, through the input/output interface 150, the processor 120 may connect the voice call by connecting to the CS service network.

When receiving the incoming CS notification message or a paging request message of the CS service network over the LTE network, the processor 120 may obtain caller identification information from the incoming call information. The processor 120 may determine whether to connect the call by comparing the caller identification information with a reception control list. For example, when the caller identification information is included in a first reception control list, such as a blacklist, the processor 120 may restrict the voice call connection and maintain the connection to the LTE network. When the caller identification information is not included in the blacklist, the processor 120 may connect the voice call by connecting to the CS service network. When the caller identification information is included in a second reception control list, such as a white list, the processor 120 may connect the voice call by connecting to the CS service network.

When receiving the incoming call information, such as a paging request message of the CS service network over the LTE network, the processor 120 may send an incoming call response message, such as a paging response message, to the CS service network. The processor 120 may suspend the LTE service and receive the caller identification information, such as a circuit-switched call (CC) setup message, from the CS service network. The processor 120 may determine whether to connect the call by comparing the caller identification information with the reception control list. For example, when the caller identification information is included in the blacklist, the processor 120 restricts the voice call connection and resumes the LTE network connection. When the caller identification information is not included in the he blacklist, the processor 120 may connect the voice call by connecting to the CS service network. For example, when the caller identification information is included in the white list, the processor 120 connects the voice call by connecting to the CS service network.

The memory 130 may include volatile and/or nonvolatile memory. The memory 130 may store commands or data, such as the reception control list relating to the other components of the electronic device 101. The memory 130 may store software and/or a program 140. The program 140 includes a kernel 141, middleware 143, an application programming interface (API) 145, and/or applications 147. At least some of the kernel 141, the middleware 143, and the API 145 may be referred to as an operating system (OS).

The kernel 141 may control or manage system resources, such as the bus 110, the processor 120, or the memory 130, used for performing an operation or function implemented by the other programs, such as the middleware 143, the API 145, or the application 147. Further, the kernel 141 may provide an interface for allowing the middleware 143, the API 145, or the application 147 to access individual elements of the electronic device 101 to control or manage the system resources.

The middleware 143 may function as an intermediary for the API 145 or the applications 147 to communicate with the kernel 141, .e.g., to exchange data.

In addition, the middleware 143 may process one or more task requests received from the application 147 according to priorities thereof. For example, the middleware 143 assigns priorities for using the system resources of the electronic device 101, to at least one of the application 147. As another example, the middleware 143 performs scheduling or load balancing on the one or more task requests by processing the one or more task requests according to the priorities assigned thereto.

The API 145 is an interface through which the applications 147 may control functions provided from the kernel 141 or the middleware 143, and may include at least one interface or function, such as an instruction for file control, window control, image processing, or text control.

The input/output interface 150 may include various input/output circuitry and function as an interface that transfers instructions or data input from a user or another external device to the other elements of the electronic device 101. Further, the input/output interface 150 may output the instructions or data received from the other elements of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, or the like, but is not limited thereto. The display 160 may display various types of content, such as text, images, videos, icons, or symbols. The display 160 may display a web page.

The display 160 may include a touch screen, which receives a touch, a gesture, proximity, a hovering input, etc., using an electronic pen or a user's body part (e.g., a finger).

The communication interface 170 may include various communication circuitry and establish communication between the electronic device 101 and a first external electronic device 102, a second external electronic device 104, and/or a server 106. For example, the communication interface 170 communicates with the first external electronic device 102, the second external electronic device 104, and/or the server 106 through the network 162 using wireless communication or wired communication or via a short-range communication 164. For example, the wireless communication conforms to a cellular communication protocol including at least one of LTE, LTE-advanced (LTE-A), code division multiple access (CDMA), WCDMA, universal mobile telecommunication system (UMTS), wireless broadband (WiBro), and GSM.

The wired communication may include at least one of a universal serial bus (USB), a high definition multimedia interface (HDMI), a recommended standard 232 (RS-232), and a plain old telephone service (POTS).

The network 162 may include a telecommunications network, a computer network such as local area network (LAN) or wide area network (WAN), the Internet, and a telephone network.

The electronic device 101 may provide an LTE service in a single radio environment by use of at least one module functionally or physically separated from the processor 120.

Each of the first and second external electronic devices 102 and 104 may be the same or different type of device as the electronic device 101.

The server 106 may include a group of one or more servers.

All or some of the operations to be executed by the electronic device 101 may be executed by the first external electronic device 102, the second external electronic device 104, and/or the server 106. For example, when the electronic device 101 performs a certain function or service (automatically or by request), the electronic device 101 may request some functions that are associated therewith from the first external electronic device 102, the second external electronic device 104, and/or the server 106, instead of or in addition to executing the function or service itself. The first external electronic device 102, the second external electronic device 104, and/or the server 106 may execute the requested functions or additional functions, and may transmit the results to the electronic device 101. The electronic device 101 may provide the requested functions or services by processing the received results. For example, a cloud computing technique, a distributed computing technique, or a client-server computing technique may be used.

According to an embodiment of the present disclosure, the processor 210 may determine a current mode of the electronic device based on a result detected in at least one of the above-described sensor modules according to an example embodiment of the present disclosure. The processor 210 may generate a control signal based on the determined current mode, and may adjust an operating frequency band of a conductive member of the electronic device in a low band by controlling a tunable circuit using the corresponding control signal.

Figure 2:
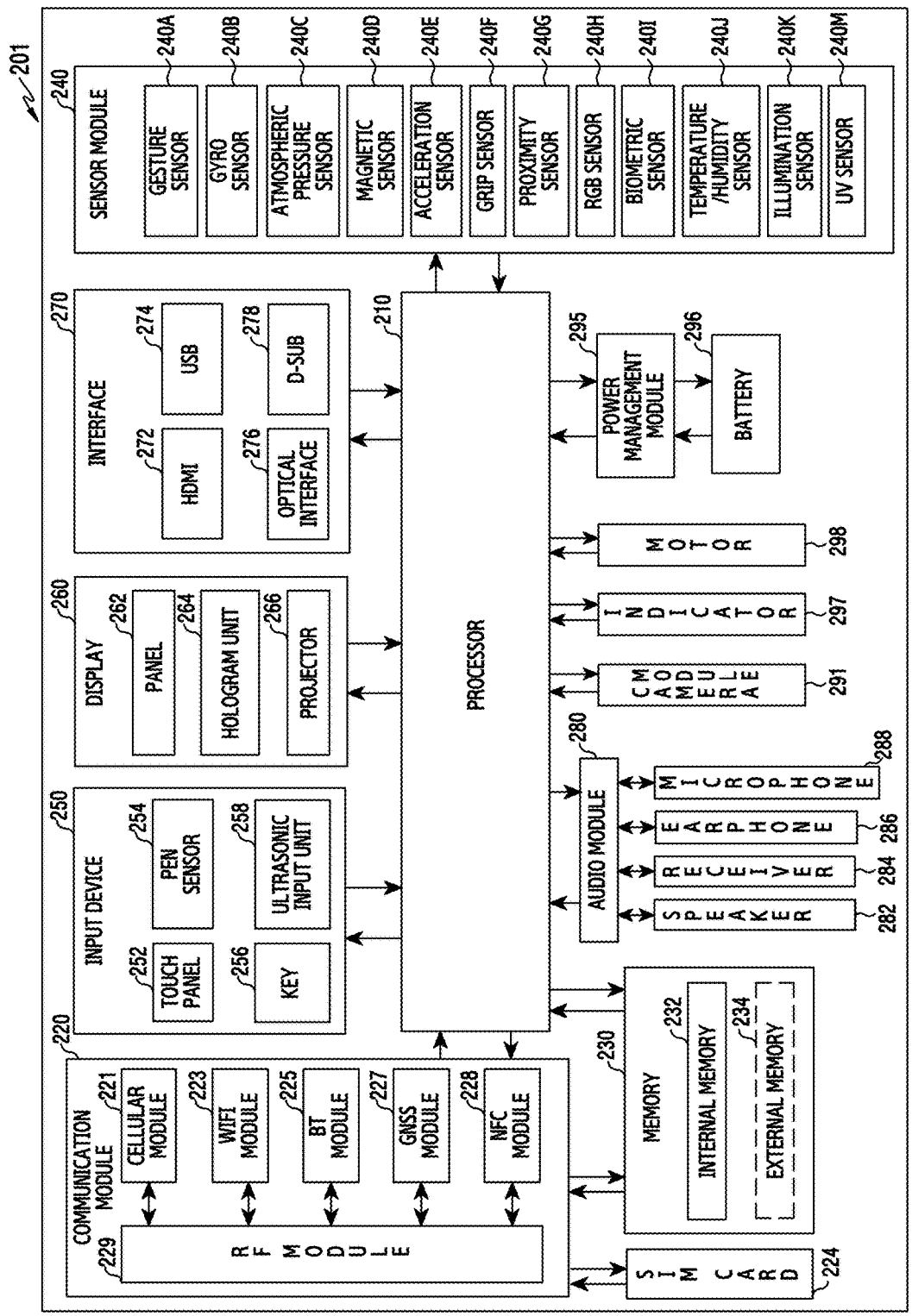
FIG. 2 is a block diagram illustrating an electronic device according to embodiments of the present disclosure.

FIG. 2 is a diagram illustrating an example electronic device, according to an embodiment of the present disclosure.

Referring to FIG. 2, the electronic device 201 includes a processor (e.g., including processing circuitry) 210, a communication module (e.g., including communication circuitry) 220, a subscriber identification module (SIM) card 224, a memory 230, a sensor module 240, an input device (e.g., including input circuitry) 250, a display 260, an interface (e.g., including interface circuitry) 270, an audio module 280, a camera module 291, a power management module 295, a battery 296, an indicator 297, and a motor 298.

The processor 210 may include various processing circuitry and control a plurality of hardware or software elements connected to the processor 210 by driving an OS or an application program. The processor 210 may process a variety of data, including multimedia data, perform arithmetic operations, may be implemented with a system on chip (SoC), and may further include a GPU.

The communication module 220 may include various communication circuitry and perform data transmission/reception between an external electronic device and/or a server, which may be connected with the electronic device through a network. The communication module 220 may include various communication circuitry, such as, for example, and without limitation, at least one of a cellular module 221, a Wi-Fi module 223, a Bluetooth® (BT) module 225, a global navigation satellite system (GNSS) or GPS module 227, a near field communication (NFC) module 228, and a radio frequency (RF) module 229.

The cellular module 221 may provide a voice call, a video call, a text service, or an Internet service through a communication network, such as LTE, LTE-A, CDMA, WCDMA, UMTS, WiBro, or GSM. In addition, the cellular module 221 may identify and authenticate the electronic device within the communication network by using the SIM card 224. The cellular module 221 may perform at least some of the functions that can be provided by the processor 210. For example, the cellular module 221 may perform multimedia control functions.

The cellular module 221 may include a CP. Further, the cellular module 221 may be implemented, for example, with an SoC.

Although elements, such as the cellular module 221, the memory 230, and the power management module 295 are illustrated as separate elements with respect to the processor 210 in FIG. 2, the processor 210 may also be implemented such that at least one part of the aforementioned elements, e.g., the cellular module 221, is included in the processor 210.

The processor 210 or the cellular module 221 may load an instruction or data, which is received from each non-volatile memory connected thereto or at least one of different elements, to a volatile memory and processes the instruction or data. In addition, the processor 210 or the cellular module 221 may store data, which is received from at least one of different elements or generated by at least one of different elements, into a non-volatile memory.

Each of the Wi-Fi module 223, the BT module 225, the GNSS module 227, and the NFC module 228 may include a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least two of the cellular module 221, the Wi-Fi module 223, the BT module 225, the GNSS module 227, and the NFC module 228 may be included in one integrated chip (IC) or IC package. For example, at least some of processors corresponding to the cellular module 221, the Wi-Fi module 223, the BT module 225, the GNSS module 227, and the NFC module 228, such as a communication processor corresponding to the cellular module 221 and a Wi-Fi processor corresponding to the Wi-Fi module 223, may be implemented with an SoC.

The RF module 229 may transmit/receive data, such as an RF signal, and may include a transceiver, a power amp module (PAM), a frequency filter, or a low noise amplifier (LNA). In addition, the RF module 229 may further include a component for transmitting/receiving a radio wave on a free space in wireless communication, e.g., a conductor or a conducting wire. The cellular module 221, the Wi-Fi module 223, the BT module 225, the GNSS module 227, and the NFC module 228 may share the RF module 229, or at least one of these modules may transmit/receive an RF signal via a separate RF module.

The SIM card 224 may be inserted into a slot formed in the electronic device. The SIM card 224 includes unique identification information, such as an integrated circuit card identifier (ICCID) or subscriber information, such as an international mobile subscriber identity (IMSI).

The memory 230 includes an internal memory 232 and/or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory. The internal memory 232 may be a solid state drive (SSD).

The external memory 234 may include a flash drive, a compact flash (CF), secure digital (SD), micro-SD, mini-SD, extreme digital (xD), and a memory stick, and may be operatively coupled to the electronic device via various interfaces.

The electronic device may also include a storage unit (or a storage medium), such as a hard drive.

The sensor module 240 may measure a physical quantity or detect an operation state of the electronic device, and convert the measured or detected information into an electrical signal. The sensor module 240 includes a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, e.g., a red, green, blue (RGB) sensor, a biometric sensor 240I, a temperature/humidity sensor 240J, an illumination sensor 240K, and an ultraviolet (UV) sensor 240M.

Additionally or alternatively, the sensor module 240 may include other sensors, e.g., an E-node sensor, an electromyography (EMG) sensor, an electroencephalogram (EEG) sensor, an electrocardiogram (ECG) sensor, and/or a fingerprint sensor.

The sensor module 240 may further include a control circuit for controlling at least one or more sensors included therein.

The input device 250 includes at least one of a touch panel 252, a (digital) pen sensor 254, a key 256, and an ultrasonic input unit 258. The touch panel 252 may recognize a touch input by using at least one of an electrostatic type configuration, a pressure-sensitive type configuration, and an ultrasonic type configuration. The touch panel 252 may further include a control circuit. When the touch panel is of the electrostatic type, both physical contact recognition and proximity recognition are possible. The touch panel 252 may further include a tactile layer, which provides the user with a tactile reaction.

The (digital) pen sensor 254 may include a recognition sheet which can be a part of the touch panel or can be separately implemented from the touch panel. The (digital)

pen sensor 254 may be implemented using the same or similar method of receiving a touch input of a user or using an additional recognition sheet.

The key 256 may include a physical button, an optical key, or a keypad.

The ultrasonic input device 258 may detect ultrasonic waves generated by an input tool through a microphone 288, and may identify data corresponding to the detected ultrasonic waves.

The ultrasonic input unit 258 may detect a reflected sound wave through the microphone 288 and perform radio recognition. For example, an ultrasonic signal, which may be generated by using a pen, may be reflected off an object and detected by the microphone 288.

The electronic device may use the communication module 220 to receive a user input from an external device, such as a computer or a server connected thereto.

The display 260 includes a panel 262, a hologram device 264, and a projector 266.

The panel 262 may be an LCD or an AM-OLED and may be implemented in a flexible, transparent, or wearable manner. Alternatively, the panel 262 may be constructed as one module with the touch panel 252.

The hologram device 264 uses an interference of light and displays a stereoscopic image in the air.

The projector 266 displays an image by projecting a light beam onto a screen, which may be located inside or outside the electronic device.

The display 260 may further include a control circuit for controlling the panel 262, the hologram device 264, and/or the projector 266.

The interface 270 may include at least one of an HDMI 272, a USB 274, an optical communication interface 276, and a d-subminiature (D-sub) 278. The interface 270 may include a mobile high-definition link (MHL), SD/multimedia card (MMC), and/or Infrared Data Association (IrDA).

The audio module 280 bilaterally converts a sound and an electric signal. The audio module 280 converts sound information, which is input or output through a speaker 282, a receiver 284, an earphone 286, and/or the microphone 288.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 captures an image and/or a video, and may include one or more image sensors, such as a front sensor or a rear sensor, a lens, an image signal processor (ISP), or a flash, such as an LED or a xenon lamp. Alternatively, the electronic device may include two or more camera modules.

The power management module 295 manages power of the electronic device. The power management module 295 may include a power management integrated circuit (PMIC), a charger IC, and/or a battery gauge.

The PMIC may be included in an IC or an SoC semiconductor and may use a wired charging and/or a wireless charging method. The charger IC may charge the battery 296 and may prevent an over-voltage or over-current flow.

Different types of wireless charging may include magnetic resonance type, magnetic induction type, and electromagnetic type. An additional circuit for the wireless charging, such as a coil loop, a resonant circuit, and/or a rectifier may be added.

The battery gauge may measure a residual quantity of the battery 296 and a voltage, current, and temperature during charging. The battery 296 stores or generates electricity and supplies power to the electronic device by using the stored or generated electricity. The battery 296 may include a rechargeable battery or a solar battery.

The indicator 297 indicates a specific state, such as a booting state, a message, or a charging state of the electronic device or a part thereof, such as the processor 210.

The motor 298 converts an electric signal into a mechanical vibration.

Alternatively, the electronic device includes a processing unit, such as a GPU, for supporting mobile TV, which processes media data according to a protocol, e.g., digital multimedia broadcasting (DMB), digital video broadcasting (DVB), and/or media flow.

Each of the aforementioned elements of the electronic device 201 may include one or more components, and the names thereof may vary depending on a type of the electronic device 201. Some of the elements illustrated in FIG. 2 may be omitted, and/or additional elements may be included therein. In addition, some of the elements of the electronic device 201 may be combined and constructed as a single entity, so as to equally perform functions of corresponding elements before combination.

At least some parts of the electronic device 201, such as modules or functions thereof, or operations, may be implemented with an instruction stored in a non-transitory computer-readable storage media. The instruction may be executed by the processor 210, to perform a function corresponding to the instruction. The non-transitory computer-readable storage media may be the memory 230. At least some parts of the programming module may be executed by the processor 210. At least some parts of the programming module may include modules, programs, routines, and a set of instructions for performing one or more functions.

Although a key button assembly is illustrated and described according to embodiments of the present disclosure, as an electronic component of which at least one part is exposed to the outside of an electronic device through a display, the present disclosure is not limited thereto. For example, the electronic component may include at least one of a speaker device, a microphone device, a camera device, various sensor devices, an interface connector device, a flash device, and an external card storage device.

Figure 3A:
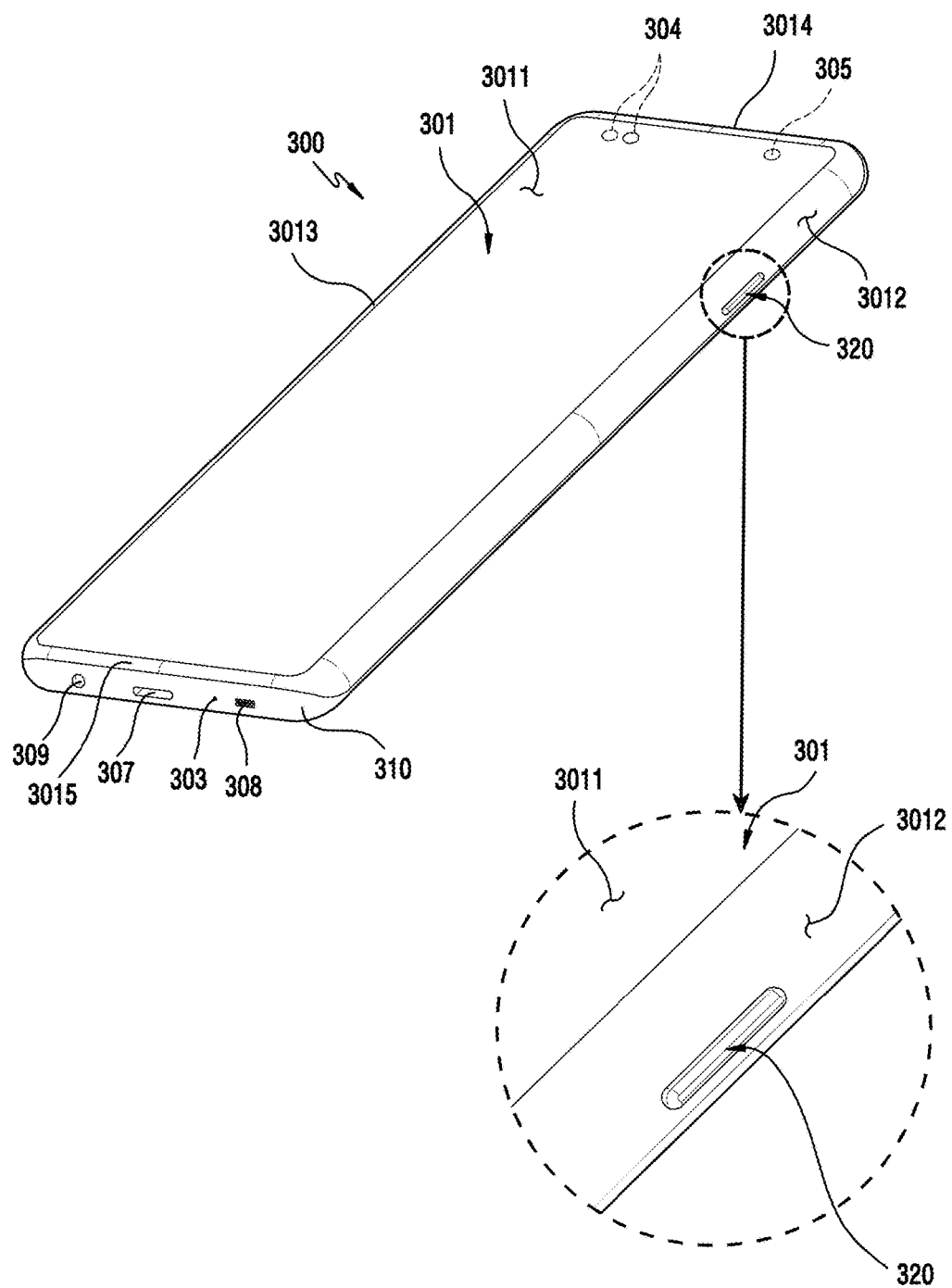
FIG. 3A is a perspective view of an electronic device according to embodiments of the present disclosure.
Figure 3B:
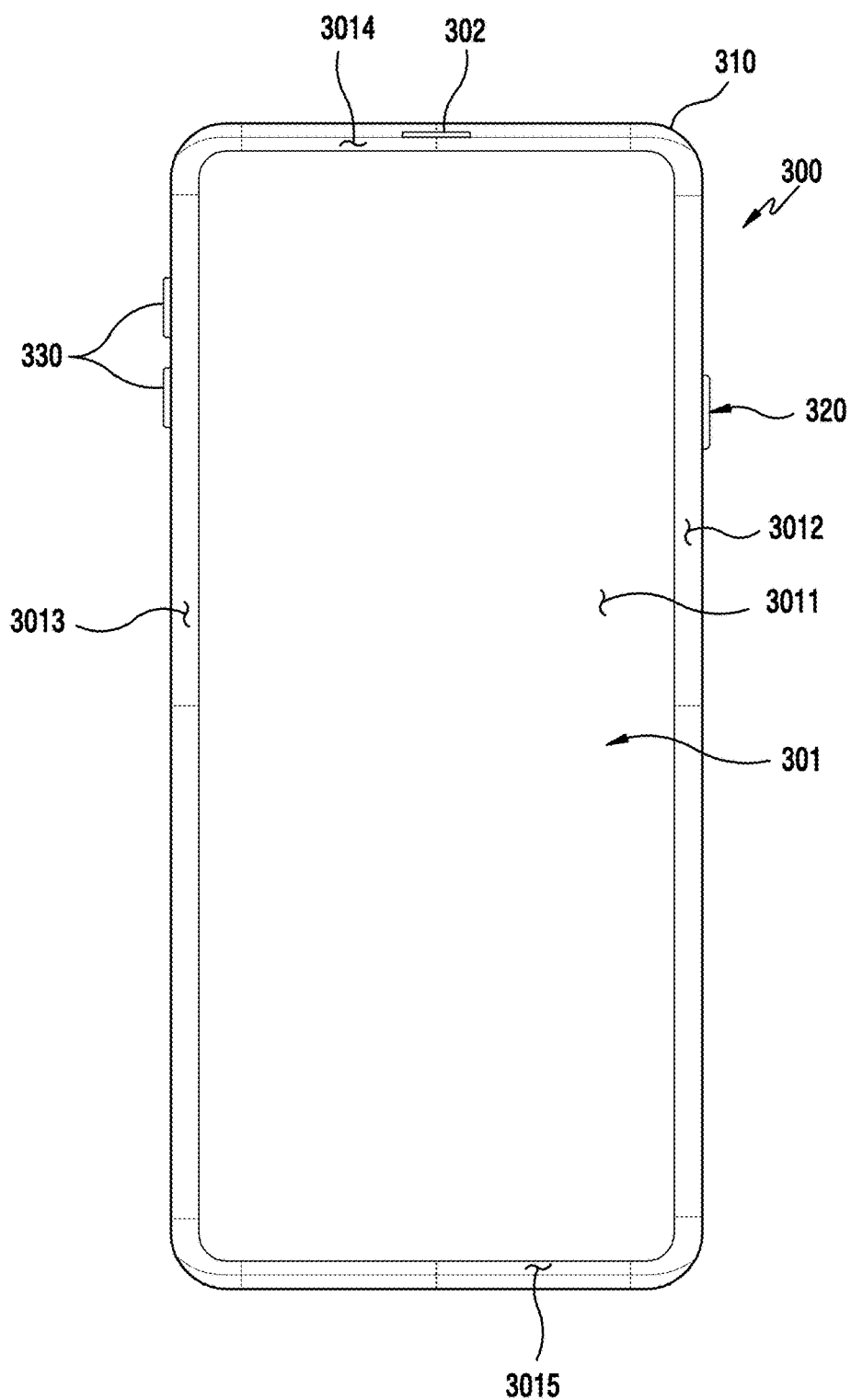
FIG. 3B is a plan view of an electronic device according to embodiments of the present disclosure.

FIG. 3A is a perspective view of an electronic device according to an embodiment of the present disclosure. FIG. 3B is a plan view of an electronic device according to an embodiment of the present disclosure.

Figure 4:
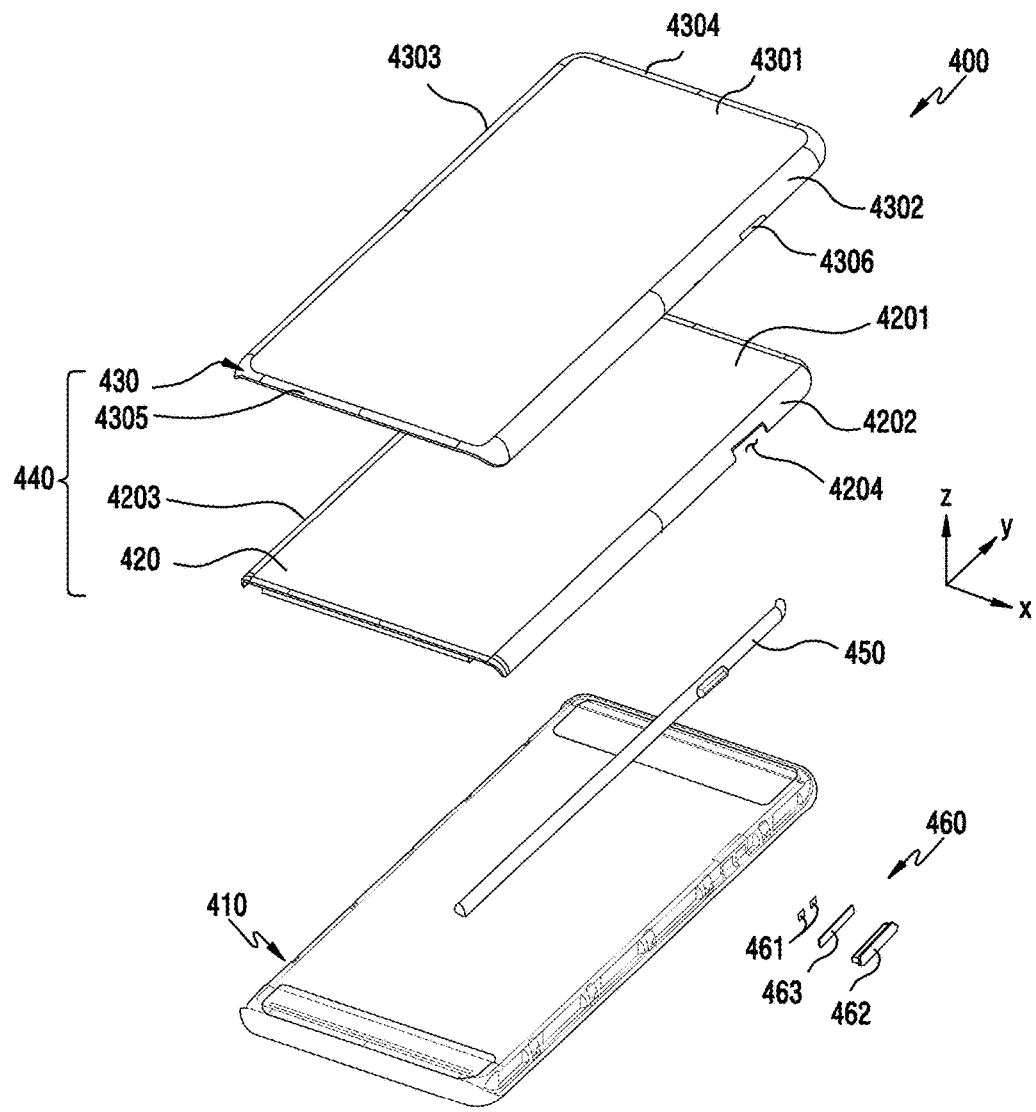
FIG. 4 is an exploded perspective view of an electronic device according to embodiments of the present disclosure.

Referring to FIG. 3A and FIG. 3B, and with reference to FIG. 4, an electronic device 300 may include a housing 310. The housing 310 may be formed of a conductive member and/or a non-conductive member. A display 301 including a window (e.g., a front window or a glass plate) may be disposed to a front surface (e.g., a first surface) of the housing 310. The display 301 may include a touch sensor to operate as a screen device. The display 301 may include a pressure sensor to operate as a pressure responsive screen device. The electronic device 300 may include a receiver 302 disposed to the housing 301 to output voice of a peer user. The electronic device 300 may include a microphone 303 disposed to the housing 310 to transmit a voice of a user to the peer user.

The electronic device 300 may include components for performing various functions of the electronic device 300, and the components may be disposed to the display in an exposed manner or may be disposed in a non-exposed manner while performing the functions through a window. The components may include at least one sensor module 304. The sensor module 304 may include at least one of an illumination sensor (e.g., an optical sensor), a proximity sensor (e.g., an optical sensor), an infrared sensor, and an ultrasonic sensor. The component may include a front camera device 305. The component may include an indicator (e.g., an LED device) for informing the user of status information of the electronic device.

A speaker 308 may be disposed to one side of the microphone 303. A connector port 307 may be disposed to the other side of the microphone 303 to charge the electronic device 300 by using a data transmission/reception function provided by an external device or by receiving external power. An ear jack hole 309 may be disposed to one side of the connector port 307.

According to an embodiment of the present disclosure, a display region defined in the display 301 may include substantially all parts of a front surface of the electronic device 300 and also one region of a lateral surface or one region of a rear surface including the lateral surface. In this case, the aforementioned electronic components (e.g., at least one of the speaker device, the microphone device, the various sensor modules, and the camera device) may perform a function thereof through the display 301 (or the window) inside the electronic device, may or may be disposed to be exposed to the housing 301 instead of a display region.

The electronic device 300 may include a rear window disposed to a rear surface (e.g., a second surface) of the housing. The electronic device 300 may include a rear camera device disposed to the rear surface and at least one electronic component disposed to one side of the rear camera device. The electronic component may include at least one of an illumination sensor (e.g., an optical sensor), a proximity sensor (e.g., an optical sensor), an infrared sensor, an ultrasonic sensor, a heart rate sensor, a flash device, and a fingerprint recognition sensor.

According to an embodiment of the present disclosure, the display 301 may include a flat area 3011 and at least one bending area extended to be bent towards a lateral surface from the flat area 3011. The at least one bending area may include at least one of a first bending area 3012 which is bent towards a right lateral surface from the flat area 3011, a second bending area 3013 which is bent towards a left lateral surface from the flat area 3011, a third bending area 3014 which is bent towards an upper lateral surface from the flat area 3011, and a fourth bending area 3015 which is bent towards a lower lateral surface from the flat area 3011. At least one bending area among the bending areas 3012, 3013, 3014, and 3015 may be bent to be extended to up to at least one part of the lateral surface of the housing 301 or at least one region of a rear surface of the housing through the lateral surface.

According to an embodiment of the present disclosure, the electronic device 300 may include an electronic component of which at least one part is exposed to the outside of the electronic device through at least one bending area from the inside. As illustrated, the electronic component may include a key button assembly 320. In this case, the electronic device may be disposed in such a manner that one part of the key button assembly 320 is exposed to the outside to induce a user's manipulation.

According to an embodiment of the present disclosure, the electronic device 300 may include a display module 420 disposed such that data can be input/output to the flat area of the display 301 and also to a region including at least one bending area. The display module 420 may include a flexible display panel (film), a touch panel (film), and/or a pressure responsive sensor pad. The display 301 may be formed in such a manner that an upper surface and a rear surface are bent simultaneously (e.g., in a 3D manner). The display 301 may include a window 430 formed of a transparent glass material (e.g., sapphire glass) or a transparent synthetic resin material.

According to an embodiment of the present disclosure, the electronic device 300 may control the display 301 to selectively display information. The electronic device 300 may control the display 301 to configure an input/output screen only in the flat area 3011. The electronic device 300 may control the display 301 to configure an input/output screen by including at least one bending area 3012, 3013, 3014, or 3015 together with the flat area 3011. The electronic device 300 may control the display 301 to configure an input/output screen by using only at least one bending area 3012, 3013, 3014, or 3015 except for the flat area 3011.

According to an embodiment of the present disclosure, when the key button assembly 320 is assembled to the electronic device 300, it may be disposed in such a manner that only at least one part of the key button assembly 320 is exposed by penetrating one part of the display region of the display 301. The electronic device 300 may display a corresponding object in a visual manner around the key button assembly 320 exposed to at least one bending area 3012, 3013, 3014, or 3015 of the display region of the display 301 to induce a manipulation of the key button assembly 320.

FIG. 4 is an exploded perspective view of an electronic device according to an embodiment of the present disclosure.

An electronic device 400 of FIG. 4 may be similar to the electronic device 300 of FIG. 3A, or may include another embodiment of the electronic device.

Referring to FIG. 4, the electronic device 400 may include a housing 410, a display 440 laminated above the housing 410, a filler 450 disposed to bending areas 4203 and 4303 of the display 440, and a key button assembly 460 disposed to the filler 450 and installed in such a manner that at least one part thereof is exposed to the outside of the electronic device through at least one part of the display 440.

According to an embodiment of the present disclosure, the display 440 may include a window 430 which forms an exterior of the electronic device 400 and a display module 420 attached to a rear surface of the window 430. The display module 420 is formed of a flexible material, and is attached to the rear surface of the window 430 by being preliminarily pressed by means of a guide film disposed to a substantially upper portion (in a window direction) of the display module 420, thereby inducing smooth adhesion in the bending area of the window 430.

According to an embodiment of the present disclosure, the window 430 may include at least one of a first bending area 4302 which is bent towards a right lateral surface from the flat area 4301, a second bending area 4303 which is bent towards a left lateral surface from the flat area 4301, a third bending area 4304 which is bent towards an upper lateral surface from the flat area 4301, and a fourth bending area 4305 which is bent towards a lower lateral surface from the flat area 4301. The window 430 may include a through-hole 4306 formed in the first bending area 4302. One part of the key button 462 of the key button assembly 460 may be penetrated by the use of the through-hole 4306. The window 430 may include printing or an additional piece construction such as a band-shaped metal or the like disposed or formed along a boundary (e.g., a border) of the through-hole 4306.

According to an embodiment of the present disclosure, the display module 420 may include a flat area 4201, a first bending area 4202 which is bent with an identical curvature at a position corresponding to the first bending area 4302 of the window 430 in the flat area 4201, and a second bending area 4203 which is bent with an identical curvature at a position corresponding to the second bending area 4303 of the window 430 in the flat area 4201. The display module 420 may include a third bending area and fourth bending area formed at positions respectively corresponding to the third bending area 4304 and fourth bending area 4305 of the window 430. The display module 420 may include an opening 4204 formed in a region of the first bending area 4202 corresponding to the through-hole 4306 of the window 430. The opening 4204 may be formed in an end portion of the display module 420 in a recessed manner, or may be formed in the display region similarly to the through-hole 4306 of the window 430.

According to an embodiment of the present disclosure, the housing 410 may include a conductive member and a non-conductive member. The housing 410 may be formed in such a manner that the non-conductive member is coupled to the conductive member by using an insert injection or double-insert injection process. The housing 410 may be formed in such a manner that the conductive member and the non-conductive member are structurally coupled (e.g., adhesive taping, bonding, etc).

According to an embodiment of the present disclosure, the filler 450 may be disposed to be interposed between the housing 410 and a cavity region (e.g., an undercut region) formed by the curved bending areas 4202 and 4302 in a state in which the window 430 and the display module 420 are coupled. The filler 450 may be formed of at least one of a metal member, PC, glass, and a material having elasticity such as rubber, urethane, or silicon. As described below, the filler 450 may accommodate at least one part of the key button assembly 460, and may be electrically connected to a substrate disposed inside the housing 410 through a conductive member region of the housing 410.

According to an embodiment of the present disclosure, the key button assembly 460 may include a key button 462 and a node piece 463 fixed to the key button 462. The key button 462 may be fixed to the filler 450 in a flexible manner, and may be disposed in such a manner that at least one node of the node piece 463 is physically in contact with a first connection node 461 fixed to the conductive member region of the housing 410. The node piece 463 may include a substrate having a pressure sensor. The node piece 463 may sense pressure by a pressing operation of the key button 462 to provide sensing information to the substrate. A portion exposed at least to the electronic device among the key buttons 462 may be formed of the same material as the window 430 to provide an aesthetic feeling. The exposed portion may be formed of a heterogeneous material (e.g., a metal member, PC, a fiber material, etc.) different from the window 430.

According to an embodiment of the present disclosure, an improved assembling property may be provided even if the key button assembly 460 is disposed to penetrate the display 440 through the filler 450. The filler 450 to which the key button assembly 460 is installed is preferentially assembled to the bending areas 4202 and 4302 of the display 440 to which the display module 420 and the window 430 are assembled, and thereafter the display 440 to which the filler 450 is assembled may be coupled to the housing 410 in a -Z axis direction. For example, the key button assembly 460 assembled to the filler 450 may be electrically connected to a substrate disposed inside through the housing 410 by using only an operation of assembling the display 440 to the housing 410.

Figure 5A:
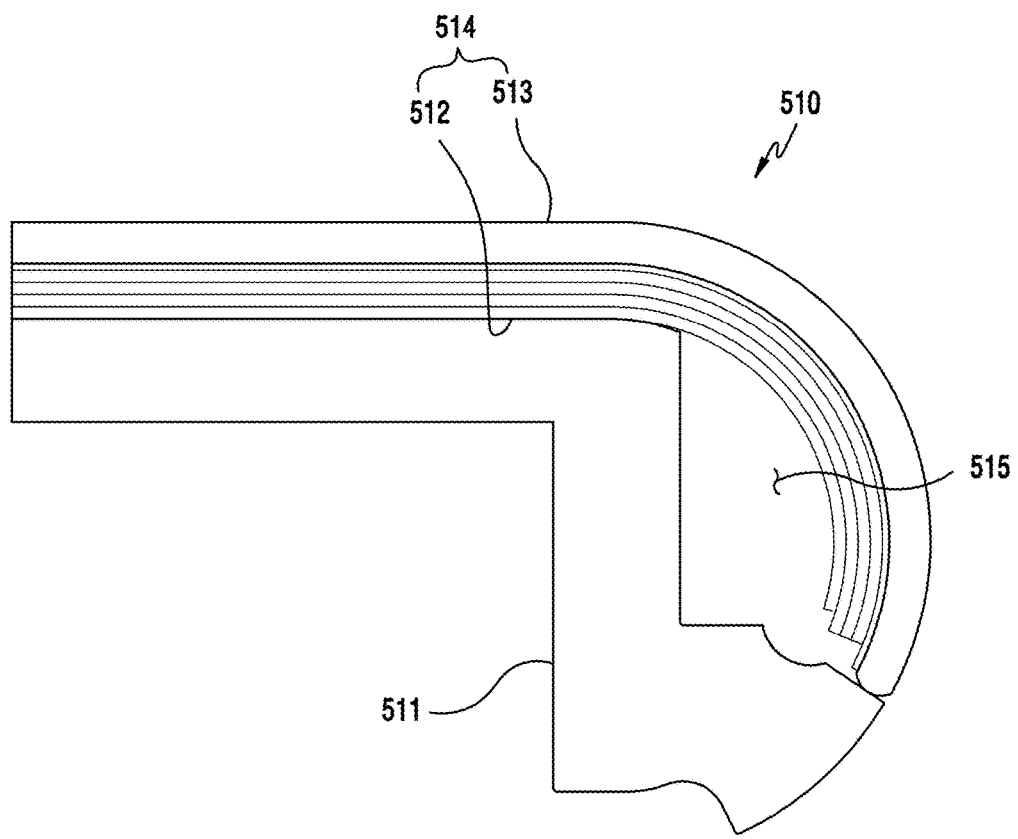
FIG. 5A to FIG. 5C illustrate a state in which a key button assembly is applied to a bended display according to embodiments of the present disclosure.
Figure 5B:
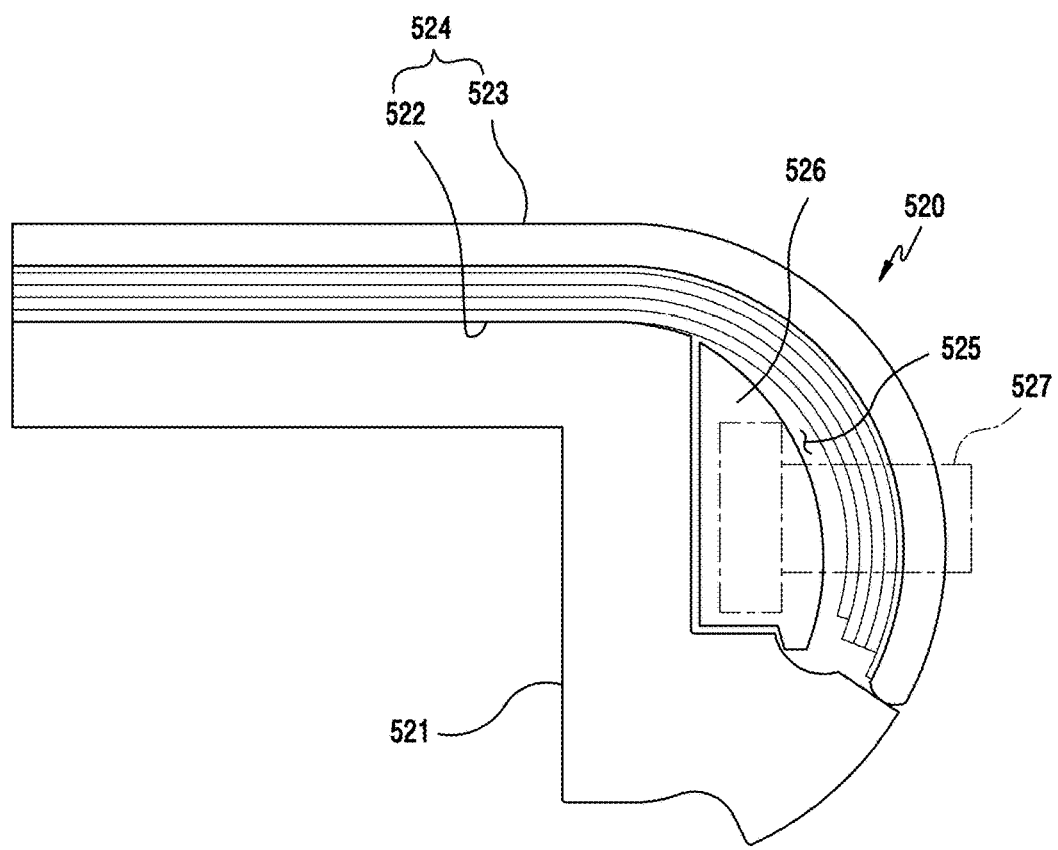
Figure 5C:
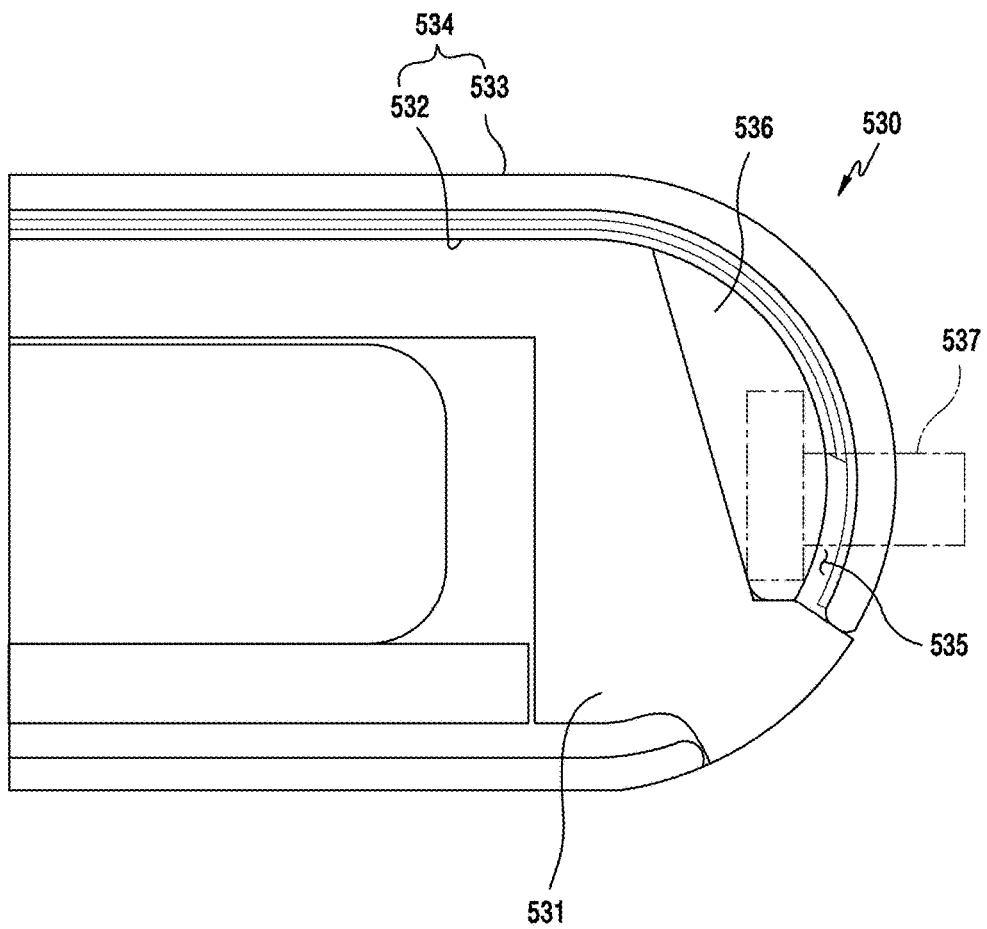

FIG. 5A to FIG. 5C illustrate a state in which a key button assembly is applied to a bended display according to an embodiment of the present disclosure.

Referring to FIG. 5A, an electronic device 510 may include a display 514 disposed in such a manner that a display module 512 is attached to a rear surface of a window 513, and a housing 511 to which the display 514 is coupled. A cavity region 515 may be formed between the housing 511 and a bending area of the display 514, and such a space may be used to dispose an electronic component based on embodiments of the present disclosure. For example, the electronic component may include a key button assembly installed to penetrate at least one part of the display 514.

Referring to FIG. 5B, an electronic device 520 may include a display 524 disposed in such a manner that a display module 522 is attached to a rear surface of a window 523, and a housing 521 to which the display 524 is coupled. A cavity region 525 may be formed between the housing 521 and a bending area of the display 524. A filler 526 (e.g., a bracket) may be disposed to the cavity region 525, and a key button assembly 527 installed through the filler 526 may be disposed to penetrate the window 523 and the display module 522 of the display 524.

Referring to FIG. 5C, an electronic device 530 may include a display 534 disposed in such a manner that a display module 532 is attached to a rear surface of a window 533, and a housing 531 to which the display 534 is coupled. A cavity region 535 may be formed between the housing 531 and a bending area of the display 534. A filler 536 (e.g., a bracket) may be disposed to the cavity region 535, and a key button assembly 537 installed through the filler 536 may be disposed to penetrate the window 533 after avoiding or detouring the display module 532 of the display 534. For example, the cavity region 535 may include a region which is cut to detour at least one part of the display module 532.

Figure 6:
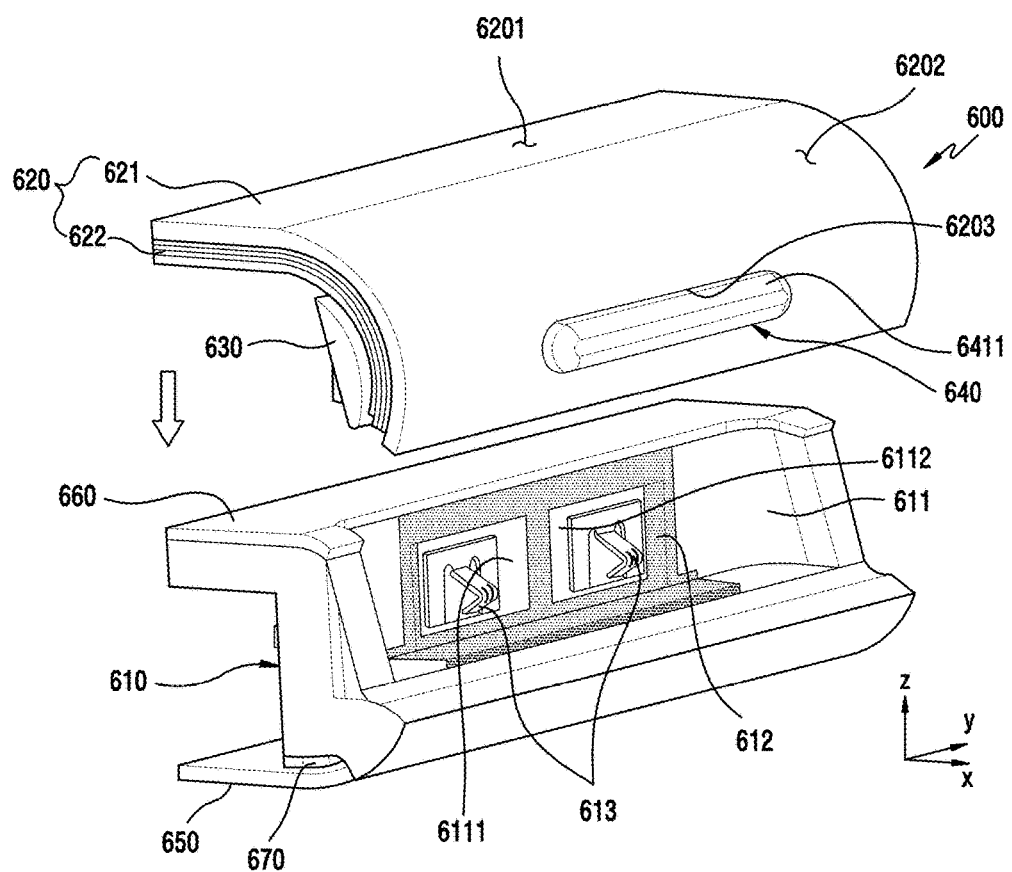
FIG. 6 is an exploded perspective view illustrating a part of an electronic device to which a key button assembly is applied according to embodiments of the present disclosure.

FIG. 6 is an exploded perspective view illustrating a part of an electronic device to which a key button assembly is applied according to an embodiment of the present disclosure.

An electronic device 600 of FIG. 6 may be similar to the electronic device 300 of FIG. 3A or the electronic device 40 of FIG. 4, or may include another embodiment of the electronic device.

Figure 7A:
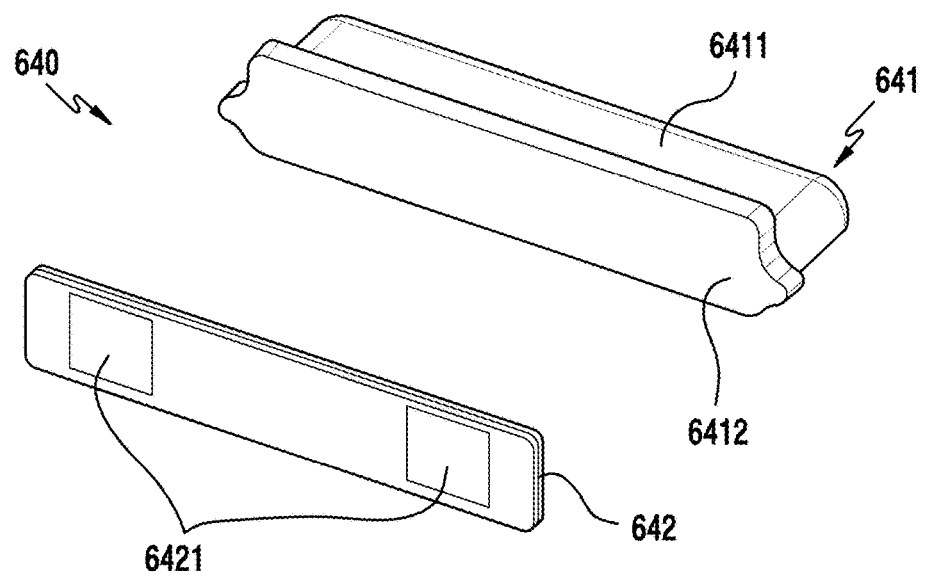
FIG. 7A is an exploded perspective view of a key button assembly according to embodiments of the present disclosure.

Referring to FIG. 6, and with reference to FIG. 7A, the electronic device 600 may include a display 620, a filler 630 disposed inside a bending area 6202 of the display 620, a key button assembly 640 installed to the filler 630 and disposed such that one part of a key top 6411 is exposed to the outside of the electronic device 600 by penetrating the display 620, and a housing 610 installed to the display 620 including the filler 630 and the key button assembly 640. The electronic device 600 may further include a rear window 650 disposed to a rear surface of the housing 610.

According to an embodiment of the present disclosure, the display 620 may include a window 621 and a display module 622 attached to the rear surface of the window 621. The display 620 may include a flat area 6201 and a bending area 6202 extended to be bent in a direction of a lateral surface from the flat area 6201. The bending area 6202 may be extended to up to at least one region of the rear surface through the lateral surface or at least one region of the lateral surface of the electronic device 600. The key top 6411 of the key button assembly 640 installed to the filler 630 may be disposed in such a manner that one part thereof is exposed (e.g., protrudes) to the outside by penetrating a though-hole 6203 of the display 620. A seal member 660 may be disposed between the housing 610 and the display module 622 of the display 620 to prevent external moisture and foreign materials from being introduced through the display 620. A seal member 670 may also be disposed between the rear window 650 and the housing 610 to perform waterproof and dustproof functions.

According to an embodiment of the present disclosure, the housing 610 may be formed in such a manner that a conductive member 611 and a non-conductive member 612 are double injected. When the display 620 is installed to the housing 610, a region corresponding to an exposing node 6421 of the key button assembly 640 may be contributed as independent conductive connection regions 6111 and 6112 (e.g., a metal island) by means of the non-conductive member 612. The conductive connection regions 6111 and 6112 may be formed by using the same material as the conductive member 611 or by using different metal materials. The conductive connection regions 6111 and 6112 may be formed in such a manner that the conductive member 611 and the non-conductive member 612 are double injected and thereafter an additional conductive connection member (e.g., a metal piece or the like) is pressed and inserted to a region of the non-conductive member 612. In this case, the conductive connection member may be formed of the same material as a first connection node 613 to be in contact therewith and/or fixed thereto by considering galvanic corrosion or the like.

According to an embodiment of the present disclosure, the filler 630 to which the key button assembly 640 is installed may be preferentially assembled to the bending area 6202 of the display 622 to which the display module 622 and the window 621 are assembled, and thereafter the display 620 to which the filler 630 is assembled may be moved in a Z axis direction and then be coupled to the housing 610. For example, an exposing node 6421 of the key button assembly 640 assembled to the filler 630 may be electrically connected to a substrate inside the housing through physical contact with the first connection node 613 attached to each of the connection regions 6111 and 6112 of the housing 610 by using only an operation of assembling the display 620 to the housing 610. The first connection node 613 may include a pogo pin or a spring contact having elasticity to prevent damage when the display 620 is assembled.

Figure 7B:
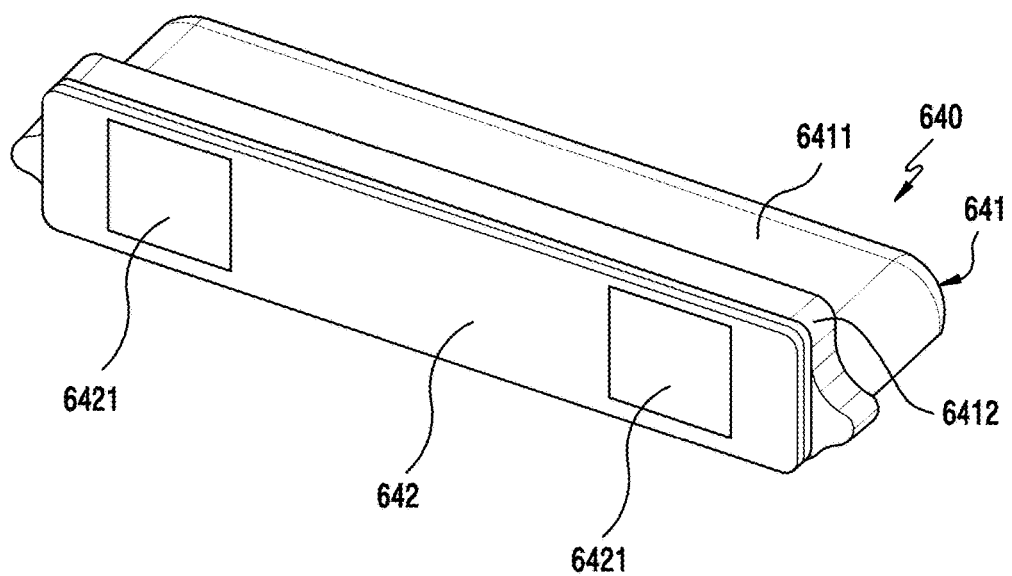
FIG. 7B is a perspective view illustrating a connection state of a key button assembly according to embodiments of the present disclosure.

FIG. 7A is an exploded perspective view of a key button assembly according to an embodiment of the present disclosure. FIG. 7B is a perspective view illustrating a connection state of a key button assembly according to an embodiment of the present disclosure.

Referring to FIG. 7A and FIG. 7B, and with reference FIG. 6, a key button assembly 640 may include a key button 641 and a node piece 642 fixed to the key button 641. According to an embodiment of the present disclosure, the key button 641 may include a key top 6411 and a key base 6412 having a substantially wider area than the key top 6411. At least one region of the key top 6411 may be installed to be exposed to the outside of the display 620. The key top 6411 may be formed of a metal material, a synthetic resin material, or a glass material. The key top 6411 may be formed of the same material as a window 621.

According to an embodiment of the present disclosure, a node piece 642 may be formed of a Printed Circuit Board (PCB) or a Flexible PCB (FPCB), and may include a pressure responsive sensor. The node piece 642 may be fixed to the key base 6412. The node piece 642 may be fixed to the key base 6412 by using bonding, taping, fusing, or the like. The node piece 642 may be disposed such that one pair of exposing nodes 6412 is exposed to the outside when it is fixed to the key base 642. The node piece 642 may generate an electric signal when a specific pressure is applied by the pressing of the key top 6411, and may provide a corresponding electrical signal to a substrate inside the housing through a connection region 6111 and 6112 of an exposing node 6421 and a housing 610.

Figure 7C:
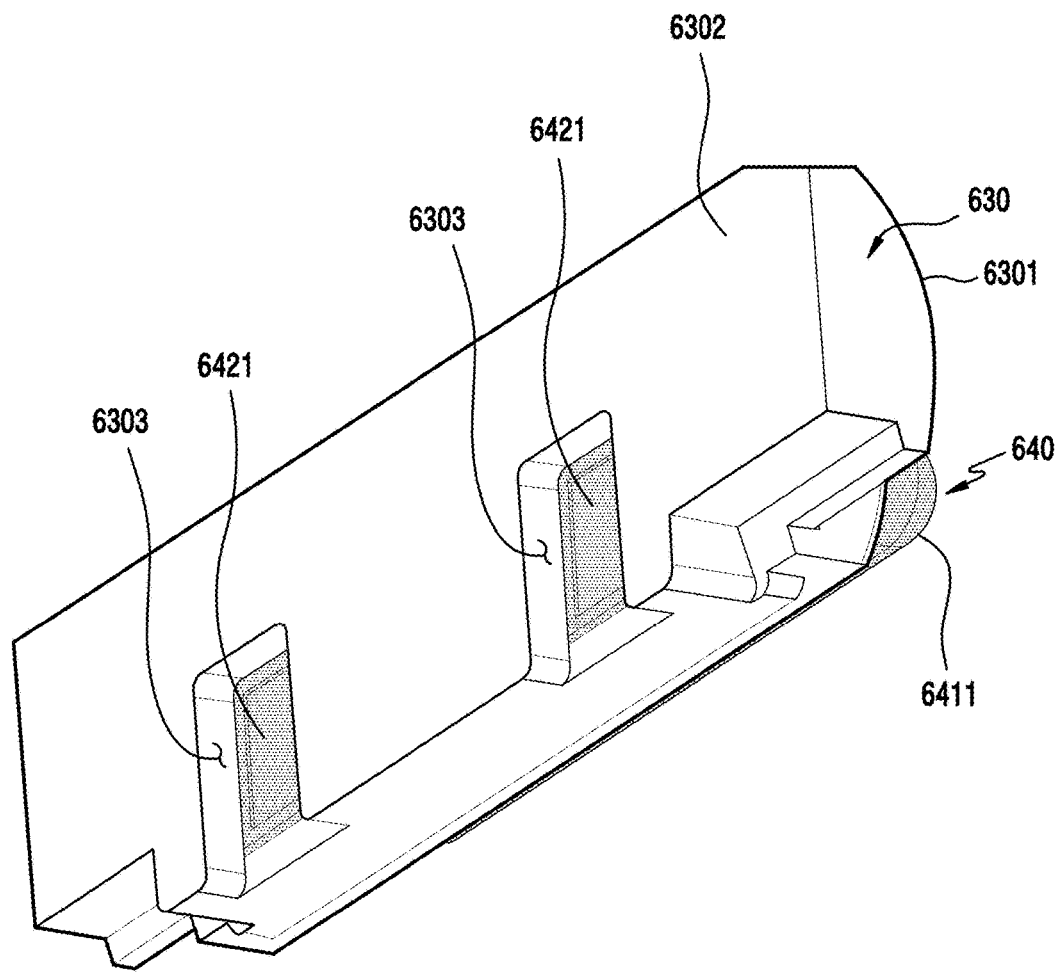
FIG. 7C and FIG. 7D illustrate a state in which a key button assembly is applied to a filler according to embodiments.
Figure 7D:
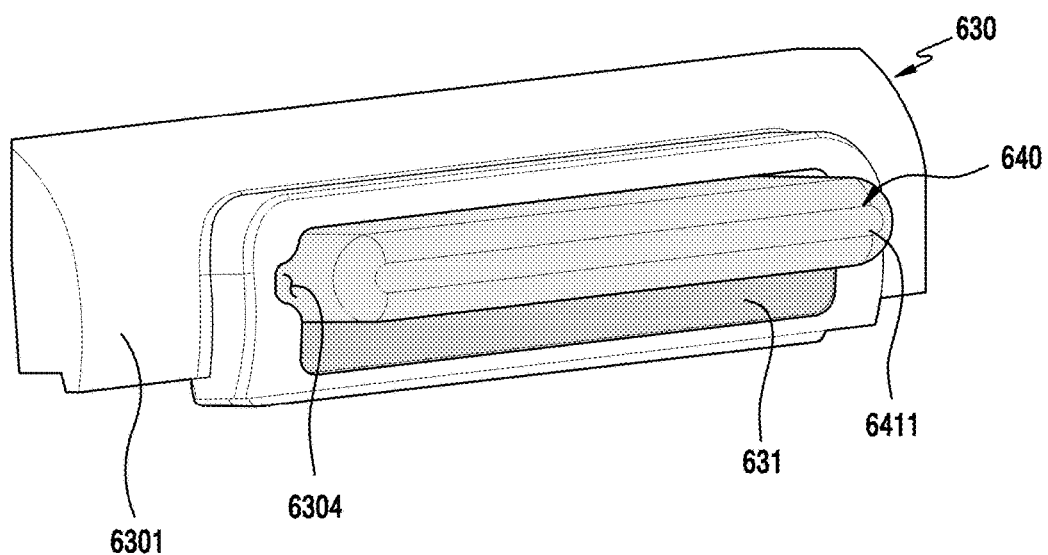

FIG. 7C and FIG. 7D illustrate a state in which a key button assembly is applied to a filler according to an embodiment of the present disclosure.

Referring to FIG. 7C and FIG. 7D, a key button assembly 640 may be fixed to a filler 630. The filler 630 may include a first surface 6301 formed to have a curved shape in a concaved manner in association with a bending area 6202 of a display 620 and a second surface 6302 formed to have a flat shape in a direction facing the first surface 6301. The key button assembly 640 may be fixed after being inserted through the key button accommodating hole 6304 formed in the first surface 6301. The key button assembly 640 fixed to the key button accommodating hole 6304 may be disposed in such a manner that an exposing node 6421 of the node piece 642 is exposed to the outside through an opening portion 6303 formed in the second surface 6302 of the filler 630. Since the key button accommodating hole 6304 is formed to have a size capable of accommodating up to a key base 6412 having a substantially wider area than the key top 6411, a deviation prevention piece 631 may be further installed to finish remaining regions after the key button assembly 640 is mounted. The deviation prevention piece 631 may be formed of at least one of a metal material, a rubber material, a silicon material, a urethane material, and PC. When the key button assembly 640 is mounted to the key button accommodating hole 6304 and the deviation prevention piece 631 is fixed, the key button assembly 640 may be controlled not to be deviated to the outside from the key button accommodating hole 6304 of the filler 630.

Figure 8A:
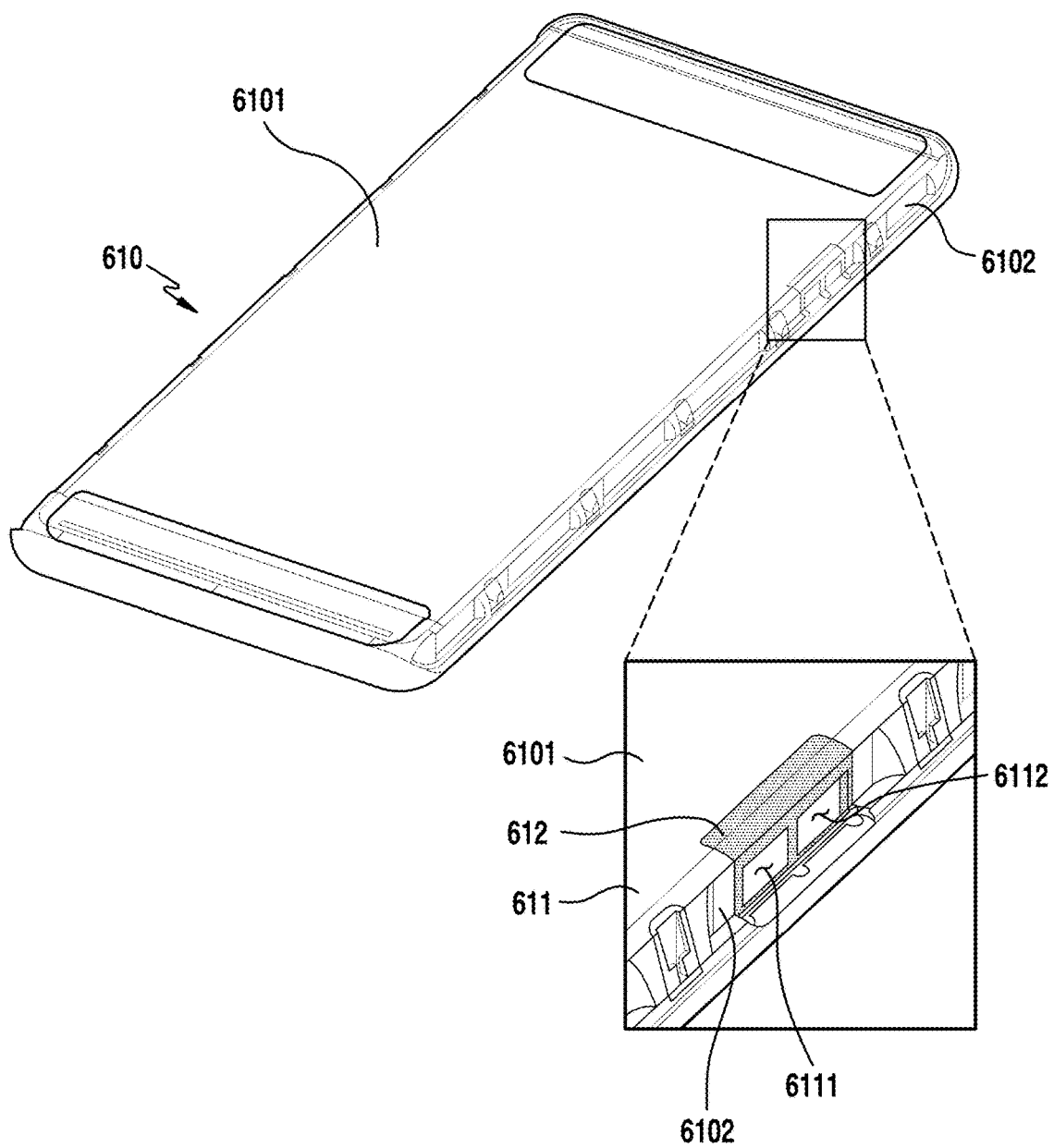
FIG. 8A to FIG. 8C illustrate a state in which a connection node is applied to a housing according to embodiments of the present disclosure.
Figure 8B:
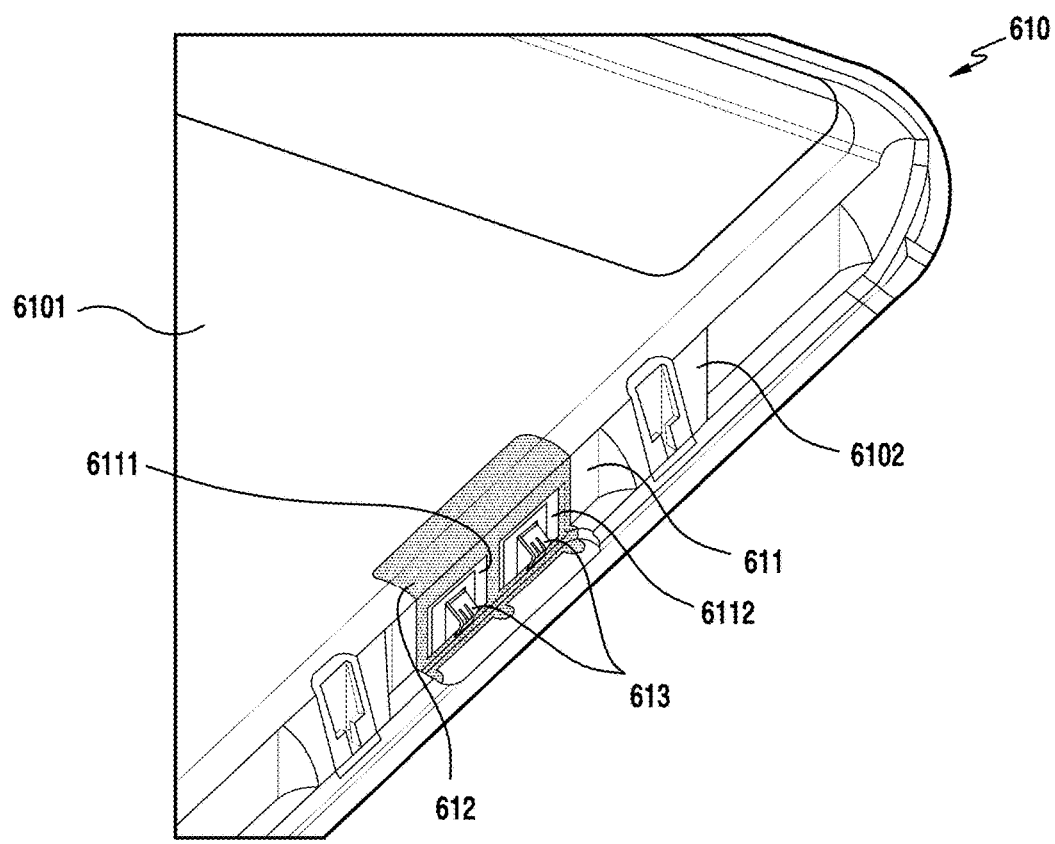
Figure 8C:
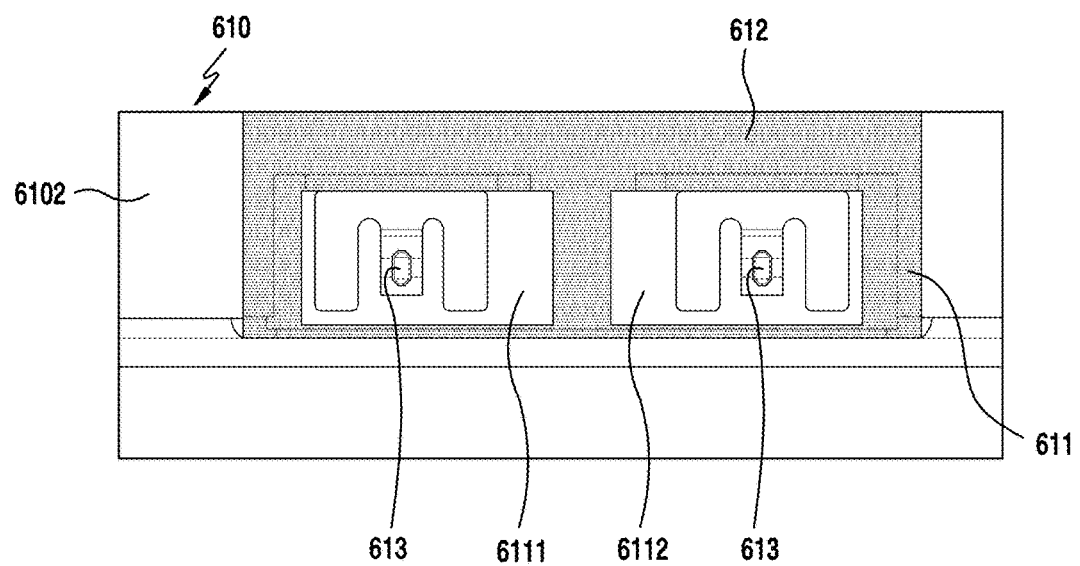

FIG. 8A to FIG. 8C illustrate a state in which a connection node is applied to a housing according to an embodiment of the present disclosure.

Referring to FIG. 8A, and with reference to FIGS. 6 and 7A, a housing 610 may include a conductive member 611 configured for rigidity reinforcement and a non-conductive member 612 coupled to the conductive member 611. According to an embodiment of the present disclosure, the housing 610 may be formed by coupling the non-conductive member 612 to the conductive member 611 through insert injection processing, double injection processing, or structural coupling.

The housing 610 may include a first surface 6101 and a lateral surface 6102 extended from the first surface 6101 to have a height. The first surface 6101 may include a region substantially corresponding to a flat area 6201 of a display 620, and the lateral surface 6102 may include an area substantially corresponding to a bending area 6202 of a display 620. A region corresponding to an exposing node 6421 of a node piece 642 in the lateral surface 6102 may include one pair of connection regions 6111 and 6112 formed to be electrically insulated from the neighboring conductive member 611 by means of the non-conductive member 612. The connection regions 6111 and 6112 may be formed of the same metal material as the conductive member 611 or may be formed of different metal materials. The conductive connection regions 6111 and 6112 may be formed in such a manner that the conductive member 611 and the non-conductive member 612 are double injected and thereafter an additional conductive connection member (e.g., a metal piece or the like) is pressed and inserted to a region of the non-conductive member 612. In this case, the conductive connection member may be formed of the same material as a first connection node 613 to be in contact therewith and/or fixed thereto by considering galvanic corrosion or the like.

Referring to FIG. 8B and FIG. 8C, the housing 610 may include a first connection node 613 physically in contact therewith so as to be electrically connected to the connection regions 6111 and 6112. According to an embodiment of the present disclosure, the first connection node 613 may be fixed to the connection regions 6111 and 6112 of the housing 610 by using at least one method among fusing, conductive bonding, and conductive taping.

Figure 9A:
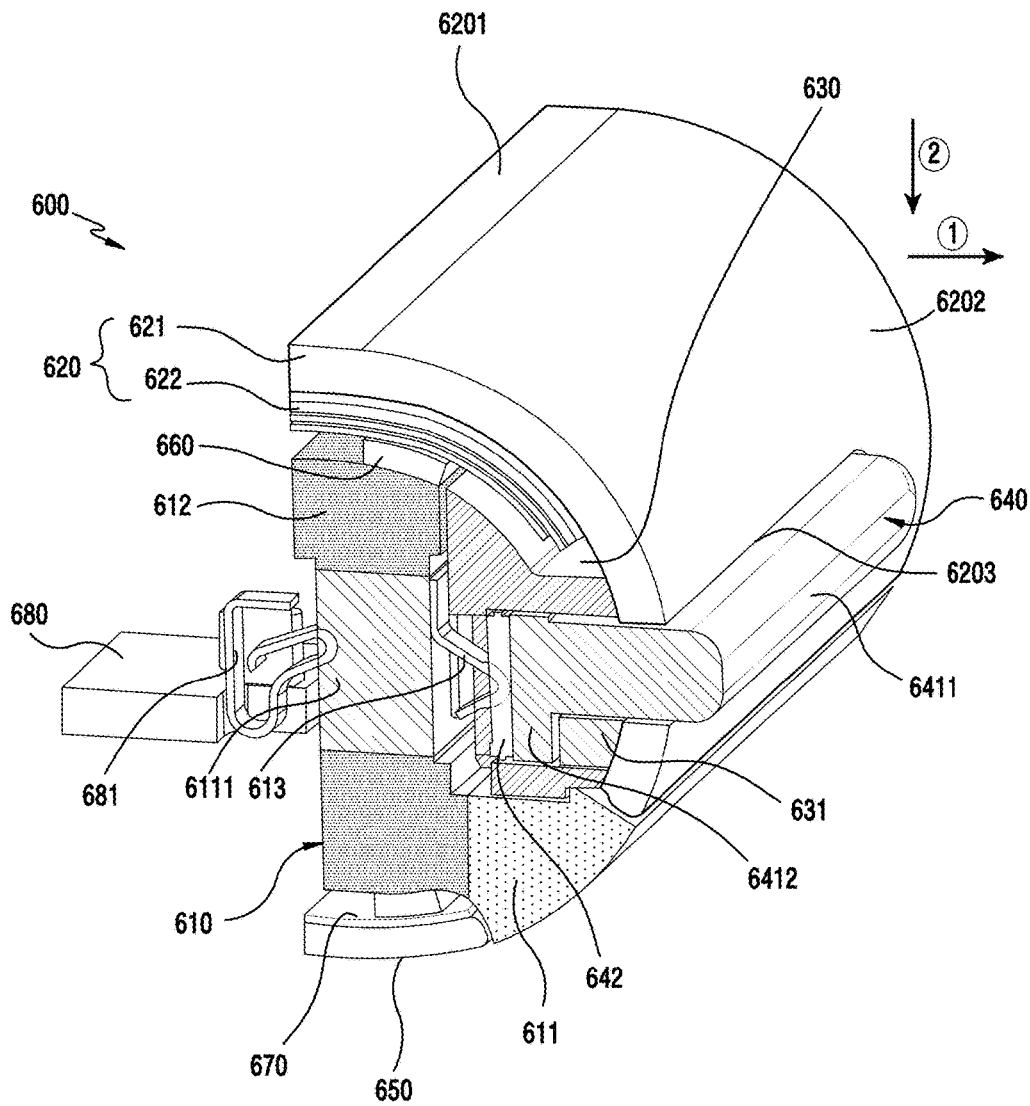
FIG. 9A and FIG. 9B are cross-sectional views illustrating a connection state of an electronic device according to embodiments of the present disclosure.
Figure 9B:
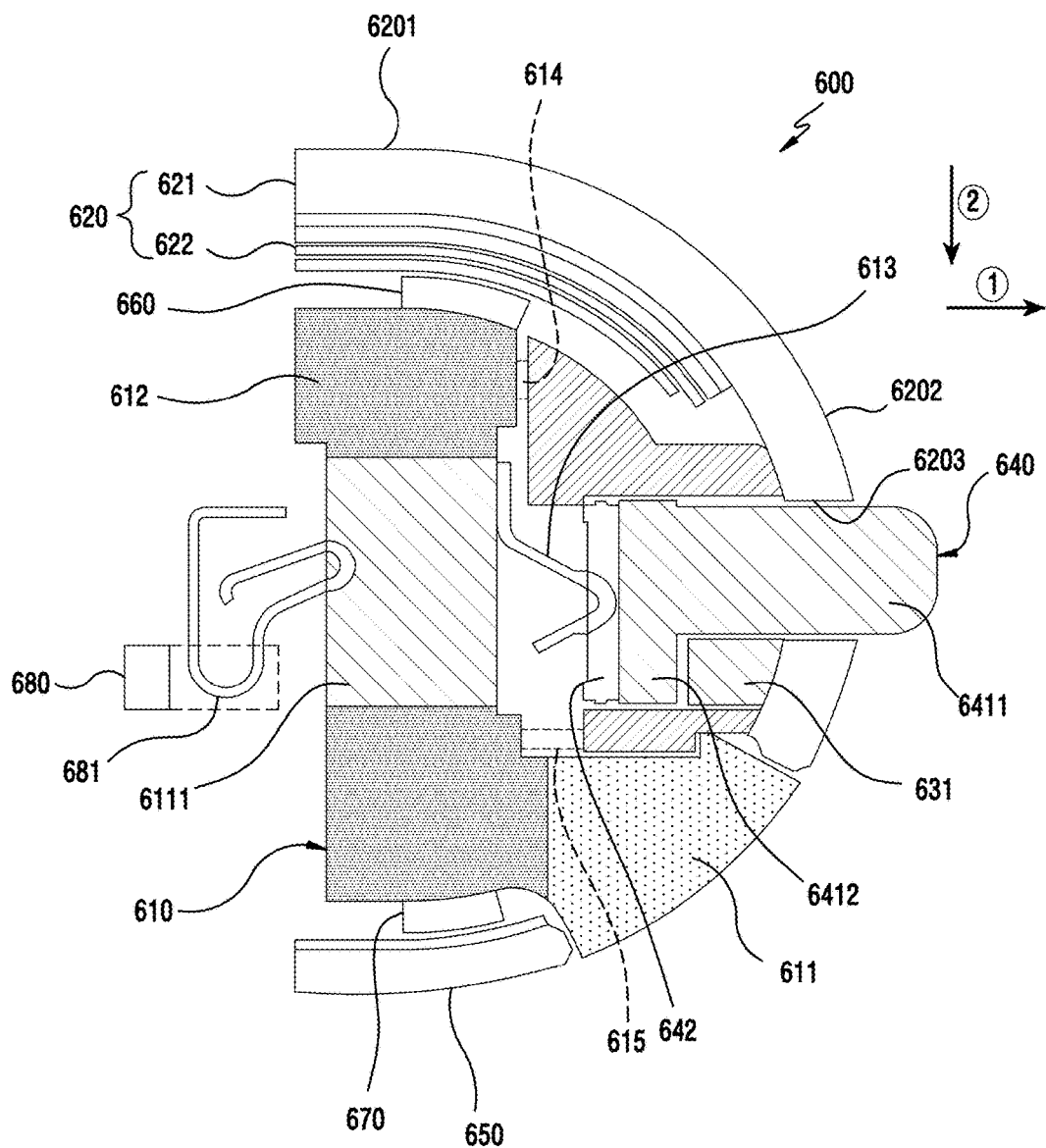

FIG. 9A and FIG. 9B are cross-sectional views illustrating a connection state of an electronic device according to an embodiment of the present disclosure. Further, FIG. 9A and FIG. 9B illustrate a structure in which the aforementioned constitutional elements of FIG. 7A to FIG. 8C are coupled with each other.

Referring to FIG. 9A and FIG. 9B, and with reference to FIG. 6, a first connection node 613 may be attached to one pair of connection regions 6111 and 6112 independently formed in a housing 610. A second connection node 681 may be attached to a substrate 680 (e.g., a main board) disposed inside the housing 610. The second connection node 681 may maintain a state of being electrically connected to the first connection node 613 through a connection region 6111 and 6112 of the housing 610. The first connection node 613, the connection region 6111, and the second connection node 681 may be formed of the same conductive material to avoid corrosion (e.g., galvanic corrosion).

According to an embodiment of the present disclosure, a display 620 may be disposed in such a manner that a display module 622 is attached to a rear surface of a window 621. The display module 622 may include a touch panel and/or a pressure sensor panel. The display 620 may include a filler 630 mounted inside a bending area 6202. The filler 630 is in a state in which a key button assembly 640 is mounted, and if the filler 630 is mounted to the bending area 6202, one part of a key top 6411 of the key button assemble 640 may be disposed to protrude to the outside through a through-hole 6203 of the display 620. In this case, an exposing node 6421 disposed to a connection piece 642 of the key button assembly 640 may maintain a state of being exposed to the outside through an opening portion 6303 of the filler 630. The filler 630 to which the key button assembly 640 is applied is mounted in a direction ① as illustrated before the display 620 is mounted to the housing 610, and thus may have a preferable assembling property.

According to an embodiment of the present disclosure, in a state in which the filler 630 is disposed to the bending area 6202 of the display 620 such that the key top 6411 of the key button assembly 640 is exposed to the through-hole 6203 of the display 620, the display 620 may be mounted to the housing 610 in a direction ② as illustrated. In this case, since the display 620 is attached to an outer surface of the housing 610 and a specific region (e.g., a boundary region) of the display module 622 by means of a seal member 660, a waterproof structure may be implemented. The electronic device 600 may implement the waterproof structure since a rear window 650 is also attached to the rear surface of the housing 610 by means of a seal member 670. At the same time, an exposing node 6421 of the key button assembly 640 may be physically in contact by being pressed with a specific pressure naturally to the first connection node 613 attached to a connection region 6111 and 6112 of the housing 610. For example, an exposing node 6421 of the key button assembly 640 is electrically connected to the first connection node 613 by using only an operation of assembling the display 620 to the housing 610, thereby improving an assembling property.

According to an embodiment of the present disclosure, an exposing node 6421 exposed to the node piece 642 of the key button assembly 640 may be physically in contact with the first connection node 613 installed to a connection region 6111 and 6112 of the housing 610. In addition, since the first connection node 613 is electrically connected to the substrate 680 by means of the second connection node 681 in a connection region 6111 and 6112 of the housing 610 and inside the housing 610, as a result, the exposing node 6421 of the key button assembly 640 may be electrically connected to the substrate 680. The key button assembly 640 disposed outside the housing 610 is electrically connected to the substrate 680 inside the housing 610 without having to pass through an additional opening portion of the housing 610 prepared for electrically connection, which may be preferable in implementation of a waterproof structure. For example, such a structure may prevent moisture from permeating into the housing 610 even if the moisture is introduced through the through-hole 6203 of the display 620.

According to an embodiment of the present disclosure, the electronic device 600 may further include one or more waterproof members 614 and 615 disposed between a neighboring region (e.g., a region surrounding the first connection node) of the first connection node 613 and the filler 630 or the node pieces 642 to prevent moisture permeation.

Figure 10:
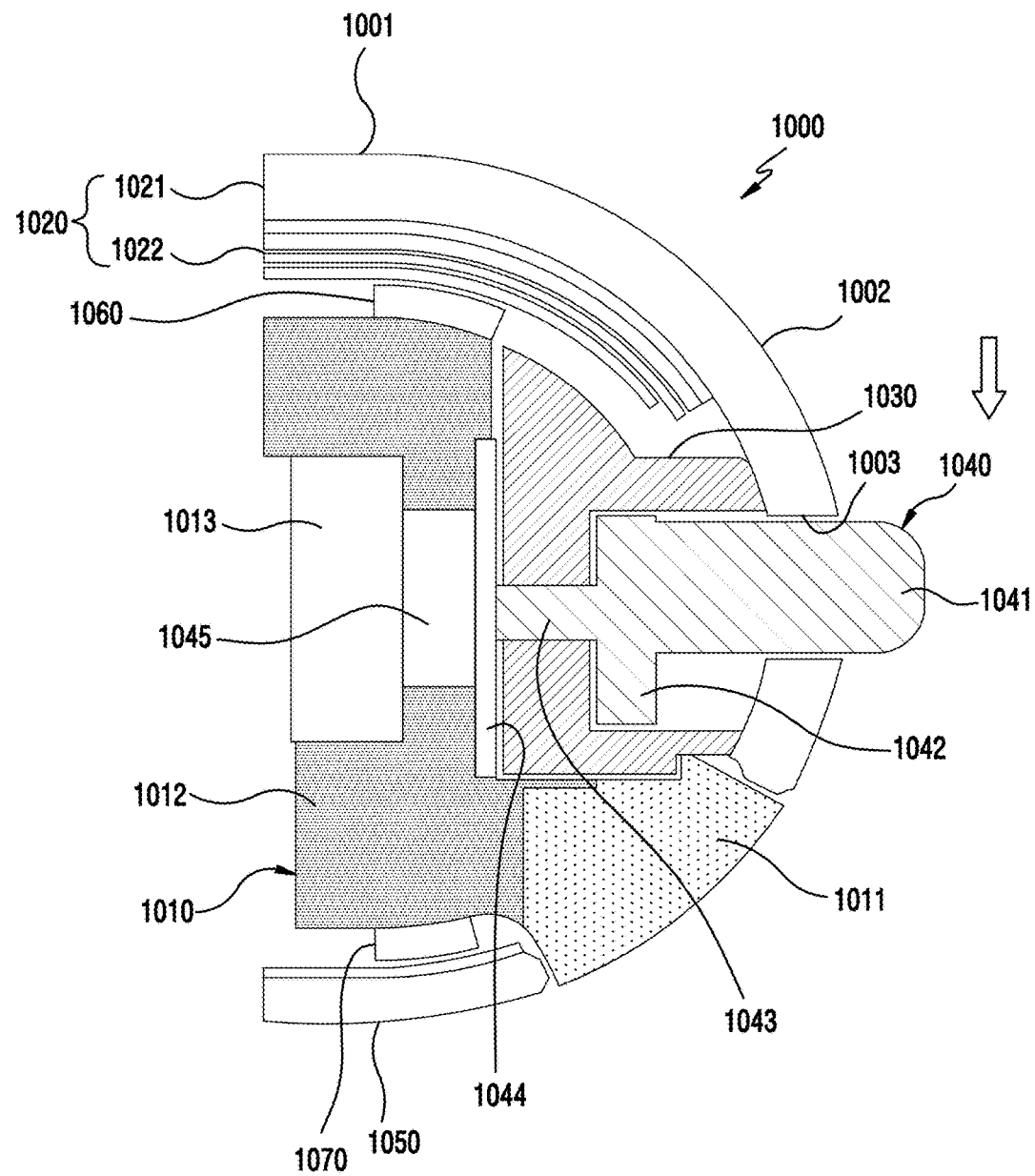
FIG. 10 is a cross-sectional view illustrating a connection state of an electronic device according to embodiments of the present disclosure.

FIG. 10 is a cross-sectional view illustrating a connection state of an electronic device according to an embodiment of the present disclosure.

An electronic device 1000 of FIG. 10 may be similar to the electronic device 300 of FIG. 3A or the electronic device 40 of FIG. 4, or may include another embodiment of the electronic device.

Referring to FIG. 10, the electronic device 1000 may include a housing 1010, a display 1020 installed to a front surface of the housing 1010 and including a flat area 1001 and a bending area 1002, a filler 1030 disposed between the housing 1010 and the bending area 1002 of the display 1020, and a key pad assembly 1040 disposed in such a manner that a through-hole 1003 formed in the bending area 1002 of the display 1020 is at least partially penetrated in the filler 1030.

According to an embodiment of the present disclosure, the housing 1010 may include a conductive member 1011 and a non-conductive member 1012. The housing 1010 may include a pressure sensor 1045 inserted to be insulated from the conductive member 1011 in a region of the non-conductive member 1012. The pressure sensor 1045 may be disposed to be coplanar with an outer surface of the housing 1010 or to be lower than the outer surface thereof. A seal member 1044 for waterproofing may be disposed to the outer surface of the housing 1010 to which the pressure sensor 1045 is disposed, so as to cover the pressure sensor 1045. The seal member 1044 may be formed of at least one material among rubber, silicon, and urethane. The housing 1010 may include a supporting piece 1013 disposed to support the pressure sensor 1045 in a direction of the key button assembly 1040. The supporting piece 1013 may be disposed to be physically in contact with the pressure sensor through the housing 1010. The supporting piece 1013 may be formed of a conductive material, and may be disposed to maintain a state of being electrically connected to the pressure sensor 1045. The supporting pieces 1013 may maintain a state of being electrically connected to a substrate inside the housing 1010. The supporting piece 1013 may be formed of the same material as the conductive member 1011 of the housing 1010 or may be formed of an additional heterogeneous material.

The key button assembly 1040 may include a key top 1041 of which at least one part is exposed to the through-hole 1003 formed in the bending area 1002 of the display 1020, a key base 1042 extended from the key top 1041 so as to be supported by the filler 1030, and a pressing protrusion 1043 extended from the key base 1042 and disposed to press the seal member 1044 after penetrating one part of the filler 1030.

In a state in which the filler 1030 is disposed to the bending area 1002 of the display 1020 such that the key top 1041 of the key button assembly 1040 is exposed to the through-hole 1003 of the display 1020, the display 1020 may be mounted to the housing 1010 in an arrow direction as illustrated. In this case, since the display 1020 is attached to an outer surface of the housing 1010 and a specific region (e.g., a boundary region) of a display module 1022 by means of a seal member 1060, a waterproof structure may be implemented. The electronic device 1000 may implement the waterproof structure since a rear window 1050 is also attached to the rear surface of the housing 1010 by means of a seal member 1070.

When the key top 1041 is pressed by a user, the pressing protrusion 1043 which moves in the filler 1030 may press the pressure sensor 1045 through the seal member 1044, and a substrate electrically connected to the pressure sensor 1045 through the conductive supporting piece 1013 may be provided with an electrical signal from the pressure sensor 1045. Therefore, the electronic device 1000 may perform a function corresponding to an electrical signal based on an input of the key button assembly 1040.

Figure 11A:
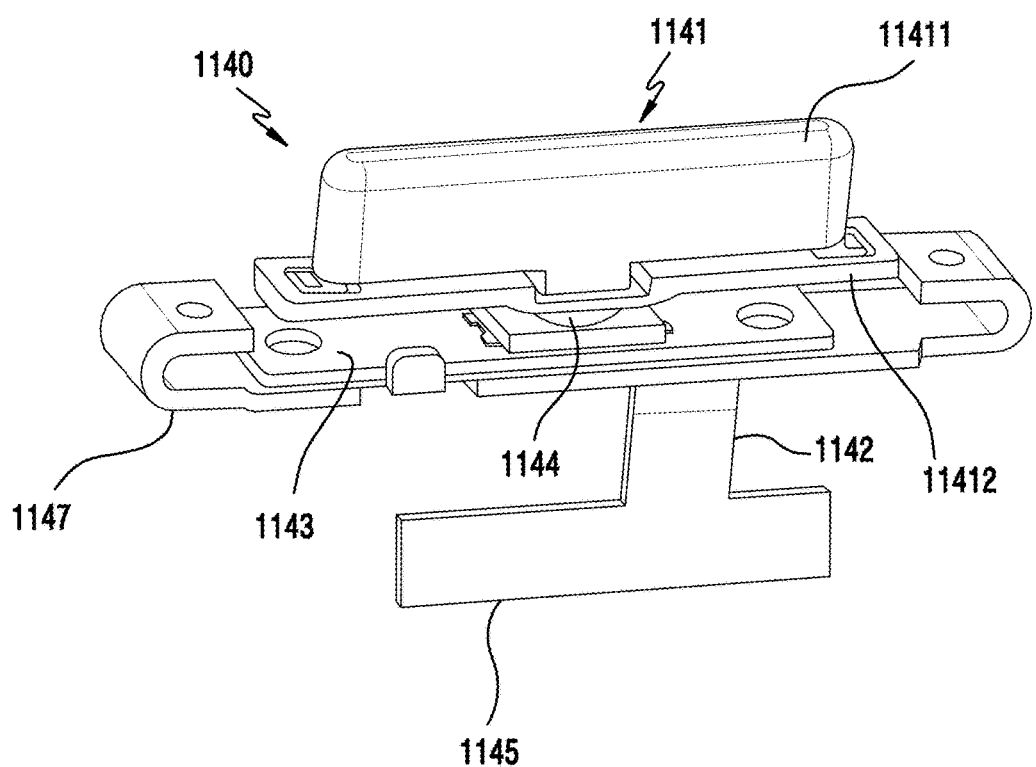
FIG. 11A illustrates a structure of a key button assembly according to embodiments of the present disclosure.

FIG. 11A illustrates a structure of a key button assembly according to an embodiment of the present disclosure.

It is described in the aforementioned structures that the key button assembly includes a pressure responsive non-driving structure in which a key top substantially does not move or does not provide tactile. Hereinafter, the key button assembly and its mounting structure will be described in detail. The key button assembly includes a driving structure for providing the same tactile as the existing key usage feeling when the key top moves within a specific movable range and thus presses a dome key.

Figure 12A:
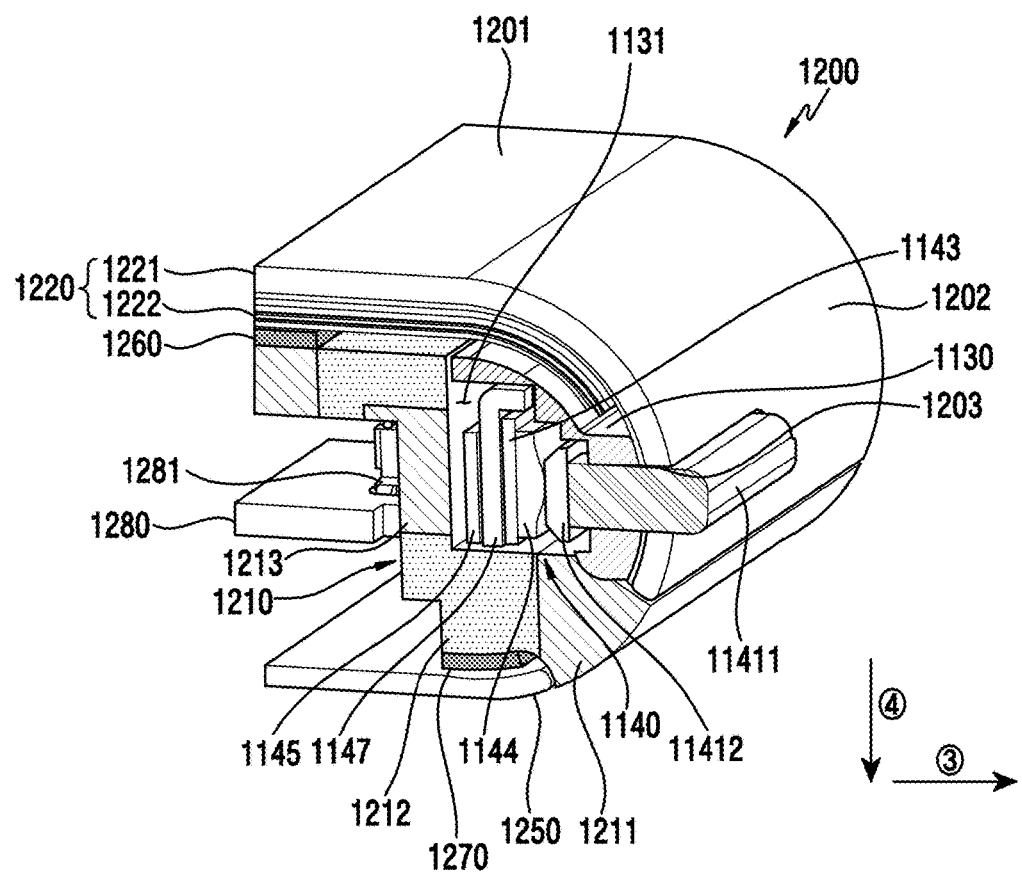
FIG. 12A and FIG. 12B are cross-sectional views illustrating a connection state of an electronic device according to embodiments of the present disclosure.

Referring to FIG. 11A, and with reference to FIG. 12A, a key button assembly 1140 may include a key button 1141, a supporting plate 1147 to which the key button 1141 is mounted, and an FPCB assembly 1142 mounted to the supporting plate 1147 to generate an electrical signal by an operation of pressing the key button 1141.

According to an embodiment of the present disclosure, the key button 1141 may include a key top 11411 and a key base 11412 having a substantially wider area than the key top 11411. At least one region of the key top 11411 may be installed to be exposed to the outside of the electronic device 1200 through a through-hole 1203 of the display 1220. An electronic device 1200 may perform a function (e.g., a volume up/down function, a wakeup/sleep function, a power on/off function, etc.) of the electronic device 1200 by using an electrical signal supplied based on pressing of the key top 11411. The key top 11411 may be formed of a metal material, a synthetic resin material, or a glass material. The key top 11411 may be formed of the same material as a window 1221. The key top 11411 and the key base 11412 may be formed integrally as a member with one material. A member with a synthetic resin material having elasticity may be attached to a key top formed of a member with a metal material in an insert injection manner or in a form of an additional member.

The FPCB assembly 1142 may include a circuit body 1143 and a connection node portion 1145 including one pair of exposing nodes 1146 disposed in a direction of a housing by detouring the supporting plate 1147 after being extracted from the circuit body 1143. A dome key 1144 (e.g., a metal dome key) may be disposed to the circuit body 1143. The dome key 1144 may be disposed to a position corresponding to the aforementioned key base 11412, and may perform an electrical switching role by a pressing operation of a pressing portion formed in the key base 11412 in a protruding manner.

According to an embodiment of the present disclosure, the supporting plate 1147 may be formed in such a manner that both ends thereof are formed in a shape of 'U', and may be disposed to have elasticity and to be supported by a key button accommodating hole 1133 of a filler 1130. The supporting plate 1147 may be formed of a metal member or a synthetic resin material, and may accommodate the circuit body 1143 to be fixed through bonding, taping, or the like.

According to an embodiment of the present disclosure, the circuit body 1143 of the FPCB assembly 1142 may be mounted in a direction facing the key button 1141 of the supporting plate 1147. The circuit body 1143 may include the dome key 1144, and the dome key 1144 may be disposed to a position facing the key base 11412 of the key button 1141. The connection node portion 1145 may be extended from the circuit body 1143 and may be fixed to an opposite surface of the supporting plate 1147 facing a surface to which the circuit body 1143 is disposed by detouring the supporting plate 1147. The connection node portion may be electrically connected directly to a PCB (e.g., a main board) of the electronic device.

Figure 11B:
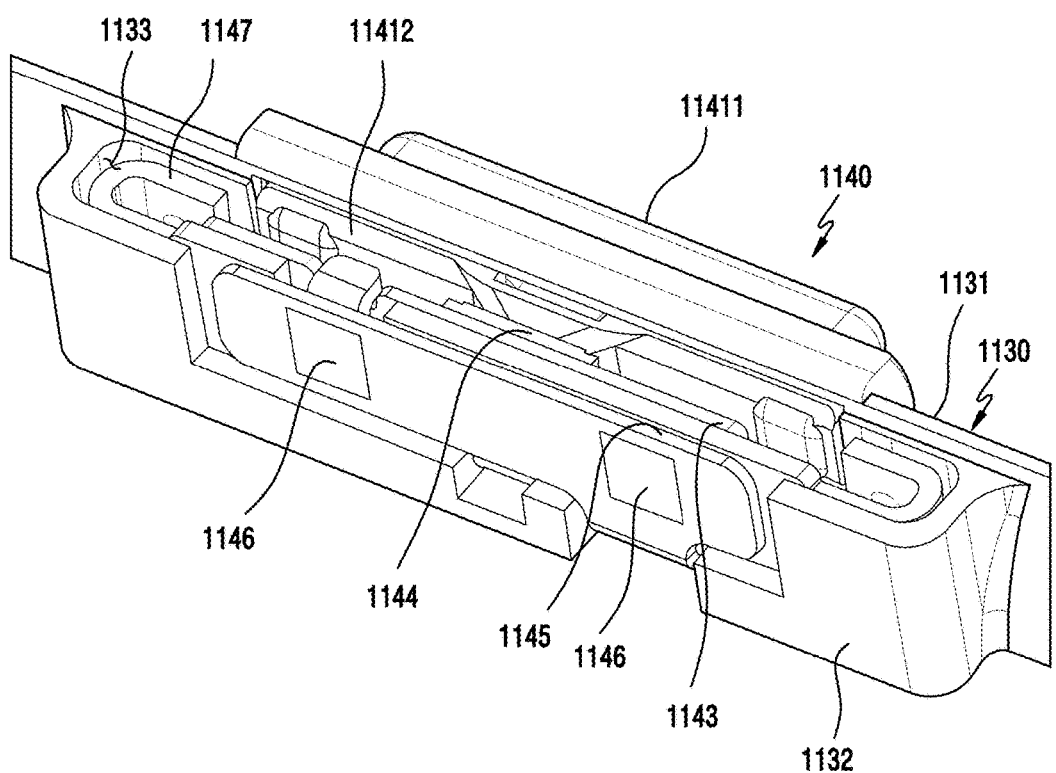
FIG. 11B illustrates a state in which a key button assembly is applied to a filler according to embodiments of the present disclosure.

FIG. 11B illustrates a state in which a key button assembly is applied to a filler according to an embodiment of the present disclosure.

Referring to FIG. 11B, and with reference to FIG. 12A, a key button assembly 1140 may be fixed to a filler 1130. The filler 1130 may include a first surface 1131 formed to have a curved shape in a concave manner in association with a bending area 1202 of a display 1220 and a second surface 1132 formed to have a flat shape in a direction facing the first surface 1131. The key button assembly 1140 may be fixed after being inserted through a key button accommodating hole 1133 formed in the first surface 1131. The key button accommodating hole 1133 may include a space prepared between the first surface 1131 and the second surface 1132. The key button assembly 1140 fixed to the key button accommodating hole 1133 may be disposed in such a manner that an exposing node 1146 of a connection node portion 1145 supported by a supporting plate 1147 is exposed to the outside through an opening portion 1134 formed in the second surface 1132 of the filler 1130.

Figure 12B:
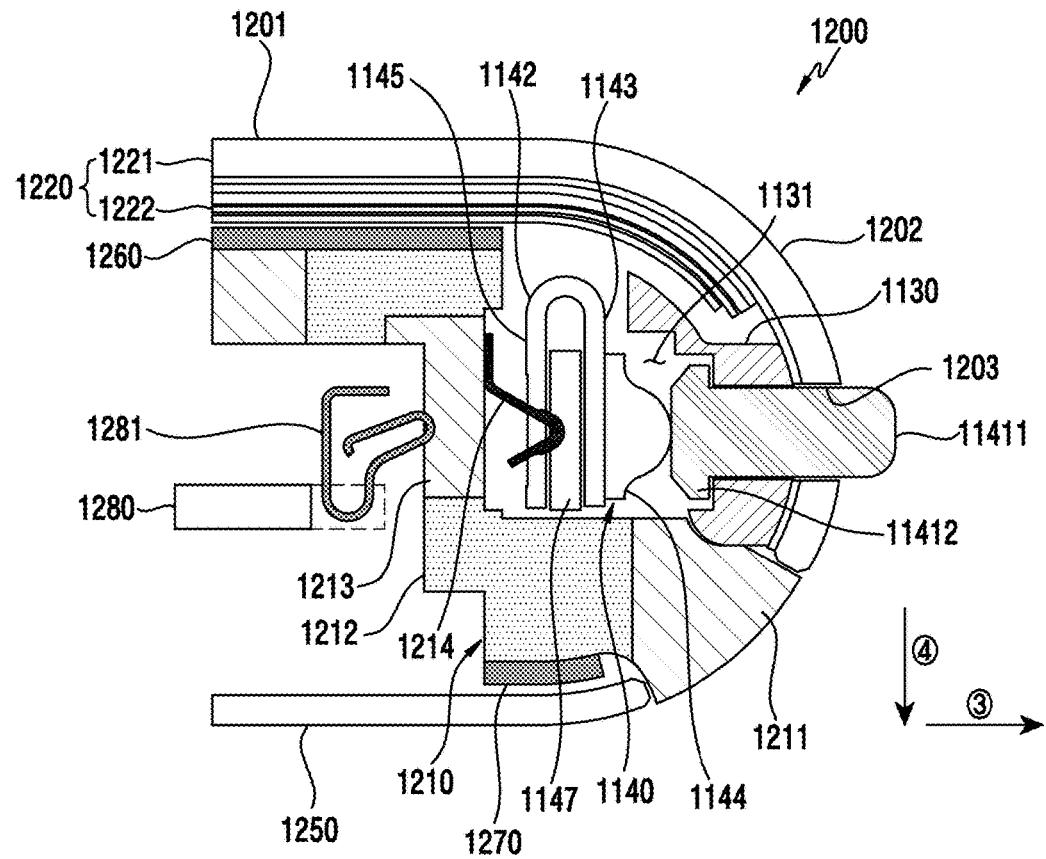

FIG. 12A and FIG. 12B are cross-sectional views illustrating a connection state of an electronic device according to an embodiment of the present disclosure.

Referring to FIG. 12A and FIG. 12B, as described above, a conductive member 1211 and a non-conductive member 1212 may be formed together in a housing 1210. The housing 1210 may include a conductive connection region 1213 electrically insulated from the neighboring conductive member 1211 by means of the non-conductive member 1212. The housing 1210 may include a first connection node 1214 attached to the connection region 1213 from the outside, and may include a second connection node 1281 connected to the connection region 1213 from the inside. The first connection node 1214 may be fixed to the connection region 1213 through a fusing process or the like. The second connection node 1281 may be fixed to a substrate 1280 inside the housing 1210, and may be elastically and tightly in contact with the connection region 1213 only with an operation of mounting the substrate 1280 to the housing 1210. Therefore, the first connection node 1214 may maintain a state of being electrically connected to the second connection node 1281 and the substrate 1280 through the connection region 1213 of the housing 1210.

According to an embodiment of the present disclosure, a display 1220 may be disposed in such a manner that a display module 1222 is attached to a rear surface of the window 1221. The display module 1222 may include a touch panel and/or a pressure sensor panel. The display 1220 may include a filler 1130 mounted inside a bending area 1202. The filler 1130 is in a state in which a key button assembly 1140 is mounted, and if the filler 1130 is mounted to the bending area 1202, one part of a key top 11411 of the key button assemble 1140 may be disposed to protrude to the outside through a through-hole 1203 of the display 1220. In this case, an exposing node 1146 disposed to a connection node portion 1145 of the key button assembly 1140 may maintain a state of being exposed to the outside through an opening portion 1134 of the filler 1130. The filler 1130 to which the key button assembly 1140 is applied is mounted in a direction ③ as illustrated before the display 1220 is mounted to the housing 1210, and thus may have an excellent assembling property.

According to an embodiment of the present disclosure, in a state in which the filler 1130 is disposed to the bending area 1202 of the display 1220 such that the key top 11411 of the key button assembly 1140 is exposed to the through-hole 1203 of the display 1220, the display 1220 may be mounted to the housing 1210 in a direction ④ as illustrated. In this case, since the display 1220 is attached to an outer surface of the housing 1210 and a specific region (e.g., a boundary region) of the display module 1222 by means of the seal member 1260, a waterproof structure may be implemented. The electronic device 1200 may implement the waterproof structure since a rear window 1250 is also attached to the rear surface of the housing 1210 by means of a seal member 1270. At the same time, an exposing node 1146 of the key button assembly 1140 may be physically in contact by being pressed with a specific pressure naturally to the first connection node 1214 attached to the connection regions 1213 of the housing 1210. For example, the exposing node 1146 of the key button assembly 1140 is electrically connected to the first connection node 1214 by using only an operation of assembling the display 1220 to the housing 1210, thereby improving an assembling property.

The exposing node 1146 exposed to the connection node portion 1145 of the key button assembly 1140 may be physically in contact with the first connection node 1214 installed to the connection region 1213 of the housing 1210. In addition, since the first connection node 1214 is electrically connected to the substrate 1280 by means of the second connection node 1281 in the connection region 1213 of the housing 1210 and inside the housing 1210, as a result, the exposing node 1146 of the key button assembly 1140 may be electrically connected to the substrate 1280. The key button assembly 1140 disposed outside the housing 1210 is electrically connected to the substrate 1280 inside the housing 1210 without having to pass through an additional opening portion of the housing 1210 prepared for electrically connection, which may be preferable in implementation of a waterproof structure. For example, such a structure may prevent moisture from permeating into the housing 1210 even if the moisture is introduced through the through-hole 1203 of the display 1220.

The electronic device 1200 may further include a waterproof member disposed between a neighboring region (e.g., a region surrounding the first connection node) of the first connection node 1214 and the filler 1130 or the connection node portions 1145 to prevent moisture permeation.

Figure 13A:
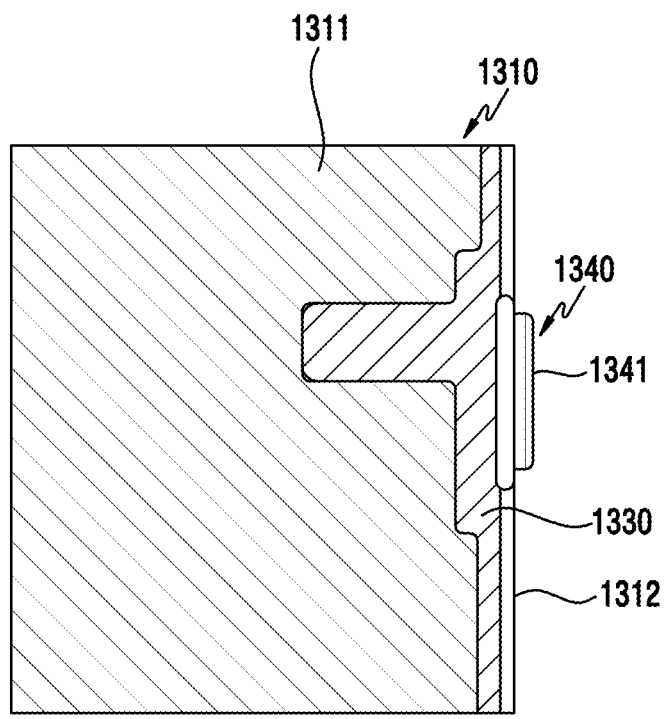
FIG. 13A to FIG. 13C illustrate a state in which a key button assembly is disposed to a housing through a filler according to embodiments of the present disclosure.
Figure 13B:
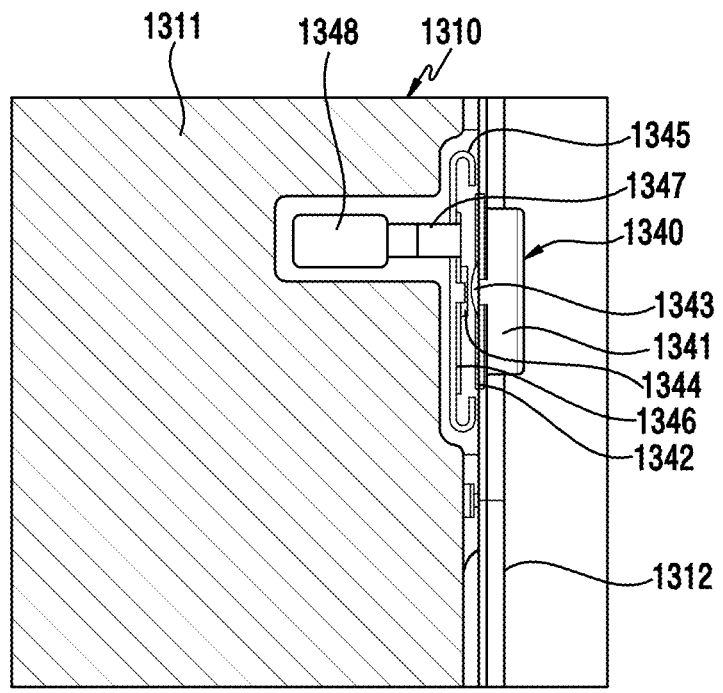
Figure 13C:
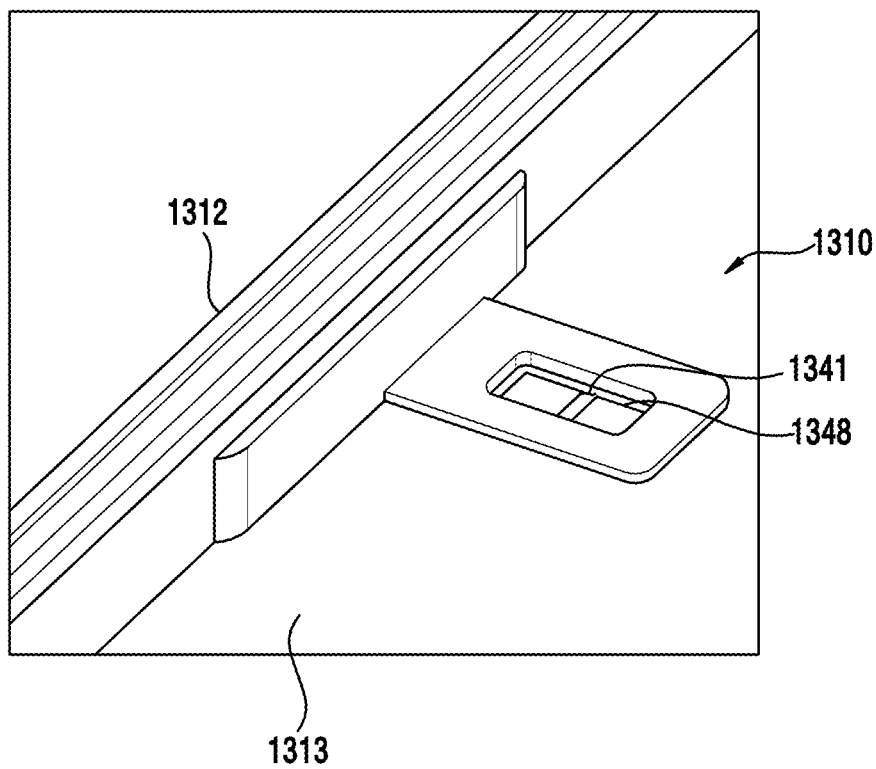

FIG. 13A to FIG. 13C illustrate a state in which a key button assembly is disposed to a housing through a filler according to an embodiment of the present disclosure.

A connection structure in which a key button assembly is electrically connected to a substrate inside a housing from a lateral surface of the housing through a filler is illustrated and described in the aforementioned embodiments. In the following embodiments, an electrical connection structure with respect to a substrate disposed inside a housing through a front surface (e.g., a first surface) instead of a lateral surface of the housing will be described.

FIG. 13A illustrates a state in which a filler 1330 including a key button assembly 1340 is mounted to a housing 1310. When the filler 1330 is mounted to the housing 1310, a key button 1341 of the key button assembly 1340 fixed to the filler 1330 may protrude in a direction of a lateral surface 1312 of the housing 1310.

FIG. 13B illustrates a structure of disposing a key button assembly 1340 after excluding a filler 1330. Although the filler 1330 is removed to illustrate a mounting structure, it is apparent that the key button assembly 1340 is installed to the filler 1330.

According to an embodiment of the present disclosure, the key button assembly 1340 may include a structure of the aforementioned dome key type, and may be disposed to the filler 1330 in a similar manner. The key button assembly 1340 may include a key button 1341, an FPCB assembly 1347 including a dome key 1344 pressed by the key button 1341, and a supporting plate 1345 supporting the FPCB assembly 1347. The key button 1341 may include a key base 1342 and a pressing protrusion 1343 protruding from the key base 1342 to press the dome key 1344. The FPCB assembly 1347 may be disposed in such a manner that a circuit body 1346 is fixed by the supporting plate 1345, and a connection node portion 1348 is extended from the circuit body 1346 to up to a proper place of a first surface 1311 of the housing 1310.

Referring to FIG. 13C, a housing 1310 may include an opening 1314 connected to an inner portion through a second surface 1313 (e.g., a rear surface) of the housing 1310 in a region in which a connection node portion 1348 of a first surface 1311 is located. The connection node portion 1348 may be electrically connected to a substrate 1380 disposed inside the housing 1310 through the opening 1314. The connection node portion 1348 may be formed to have a wider area than the opening 1314 and thus may be fixed to the housing 1310 to close the opening 1314. The connection node portion 1348 may be attached to the housing by using bonding, taping, fusing, or the like.

Figure 13D:
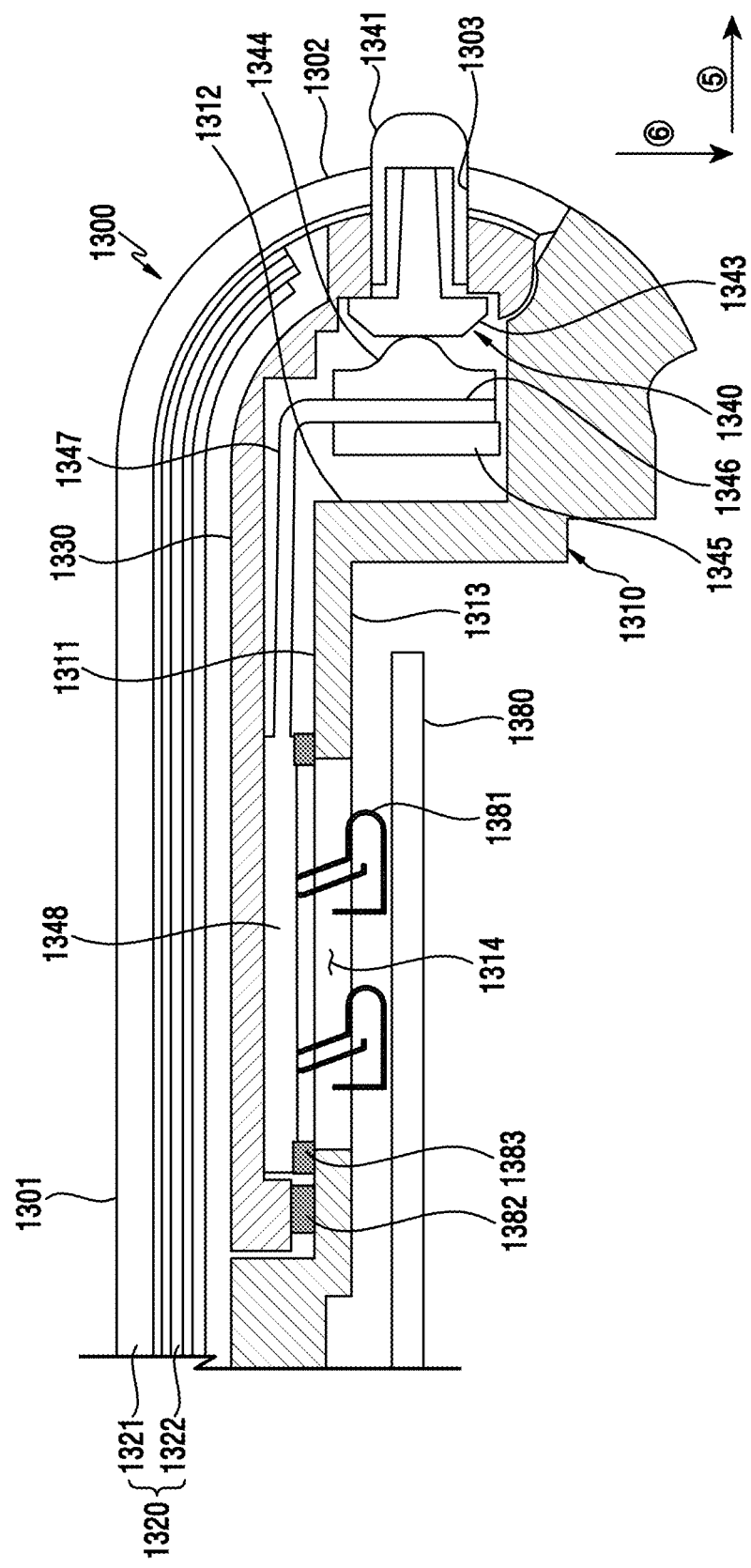
FIG. 13D is a cross-sectional view illustrating a part of a combined state of an electronic device according to embodiments of the present disclosure.

FIG. 13D is a cross-sectional view illustrating an important part of a combined state of an electronic device according to an embodiment of the present disclosure.

Referring to FIG. 13D, an electronic device 1300 may include a substrate 1380 disposed inside a housing 1310. The substrate 1380 may include at least one connection node 1381 disposed to be exposed or protrude through an opening 1314 formed on a first surface 1311 of the housing 1310.

A display 1320 may be disposed in such a manner that a display module 1322 is attached to a rear surface of a window 1321. The display module 1322 may include a touch panel and/or a pressure sensor panel. The display 1320 may include a filler 1330 mounted inside a bending area 1302 extended to be bent in a direction of a lateral surface of the housing in a flat area 1301. The filler 1330 is in a state in which a key button assembly 1340 is mounted, and if the filler 1330 is mounted to the bending area 1302, one part of the key button 1341 of the key button assemble 1340 may be disposed to protrude to the outside through a through-hole 1303 of the display 1320. The filler 1330 to which the key button assembly 1340 is applied is mounted in a direction ⑤ as illustrated before the display 1320 is mounted to the housing 1310, and thus may have a preferable assembling property.

In a state in which the filler 1130 is disposed to the bending area 1302 of the display 1320 such that the key button 1341 of the key button assembly 1340 is exposed to the through-hole 1303 of the display 1320, the display 1320 may be mounted to the housing 1310 in a direction ② as illustrated. In this case, a connection node portion 1348 extended in a direction of the first surface 1311 of the housing 1310 along the filler 1330 may be attached to the first surface 1311 of the housing 1310 to close the opening 1314 formed in the first surface 1311 of the housing 1310. The connection node portion 1348 may be electrically connected to the substrate 1380 by physically being in contact with the connection node 1381 exposed to the opening 1314 inside the housing 1310 by using only an operation of attaching to the first surface 1311 of the housing 130. At least one of seal members 1382 and 1383 is disposed between the filler 1330 and the first surface 1311 of the housing 1310 and/or between the connection node portion 1348 and the first surface 1311 of the housing 1310, thereby preventing moisture introduced to the through-hole 1303 of the display 1320 from permeating into the housing 1310 through the opening 1314.

Figure 14:
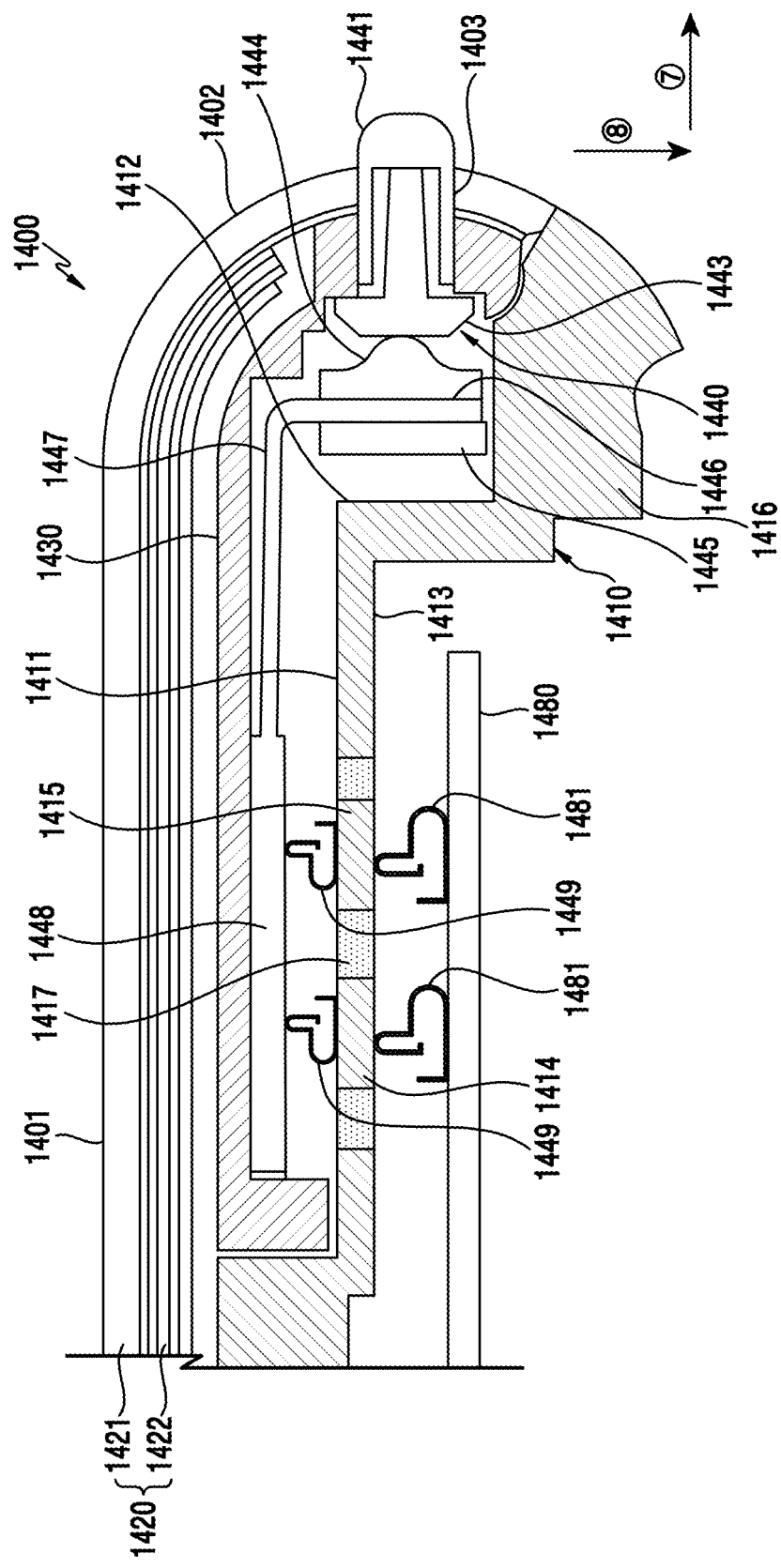
FIG. 14 is a cross-sectional view illustrating a part of a combined state of an electronic device according to embodiments of the present disclosure.

FIG. 14 is a cross-sectional view illustrating an important part of a combined state of an electronic device according to an embodiment of the present disclosure.

Although an opening formed in a housing to electrically connect a key button assembly to a substrate disposed inside the housing is used in FIG. 13A to FIG. 13D, the present embodiment illustrates and describes a structure in which the key button assembly is electrically connected to the substrate by using only a structure of a housing without an additional opening.

Referring to FIG. 14, a housing 1410 may include a first surface 1411, a second surface 1413 formed in a direction facing the first surface 1411, and a lateral surface 1412 for connecting the first surface 1411 and the second surface 1413. According to an embodiment of the present disclosure, a conductive member 1416 and a non-conductive member 1417 may be formed together in the housing 1410. The housing 1410 may include conductive connection regions 1414 and 1415 electrically insulated from the neighboring conductive member 1416 by means of the non-conductive member 1417. The housing 1410 may include a first connection node 1449 attached to the connection region 1414 and 1415 in the first surface 1411, and may include a second connection node 1481 to be in contact with the connection regions 1414 and 1415 from the inside. The first connection node 1449 may be fixed to the connection regions 1414 and 1415 through a fusing process or the like. The second connection node 1481 may be fixed to a substrate 1480 inside the housing 1410, and may be elastically and tightly in contact with the connection regions 1414 and 1415 only with an operation of mounting the substrate 1480 into the housing 1410. Therefore, the first connection node 1449 may maintain a state of being electrically connected to the second connection node 1481 and the substrate 1480 through the connection regions 1414 and 1415 of the housing 1410.

A display 1420 may be disposed in such a manner that a display module 1422 is attached to a rear surface of a window 1421. The display module 1422 may include a touch panel and/or a pressure sensor panel. The display 1420 may include a filler 1430 mounted inside a bending area 1402 extended in a curved manner in a direction of the lateral surface 1412 of the housing 1410 in a flat area 1401. The filler 1430 is in a state in which a key button assembly 1440 is mounted, and when the filler 1430 is mounted to the bending area 1420, one part of a key button 1441 of the key button assembly 1440 may be disposed to protrude to the outside through a through-hole 1403 of the display 1420. The key button assembly 1440 may be disposed in such a manner that a key base 1443 disposed to an end portion of the key button 1441 presses a dome key 1444 mounted to a circuit body 1446 of an FPCB assembly 1447 fixed to a supporting plate 1445, and may include a connection node portion 1448 extended to the first surface 1411 of the housing 1410 in the circuit body 1446. The connection node portion 1448 may be extended to up to the connection regions 1414 and 1415 of the housing 1410. The filler 1430 to which the key button assembly 1440 is applied is mounted in a direction ⑦ as illustrated before the display 1420 is mounted to the housing 1410, and thus may have an excellent assembling property.

According to an embodiment of the present disclosure, the display 1420 may be mounted to the housing 1410 in a direction ⑧ as illustrated in a state in which the filler 1430 is disposed to the bending area 1402 of the display 1420, so that the key button 1441 of the key button assembly 1440 is exposed to the through-hole 1403 of the display 1420. In this case, the connection node portion 1448 extended in a direction of the first surface 1411 of the housing 1410 along the filler 1430 may be disposed to be in contact with the first connection node 1449 installed to the connection regions 1414 and 1415 formed on the first surface 1411 of the housing 1410. The connection node portion 1448 may be fixed to the first connection node 1449 fixed to the connection regions 1414 and 1415 of the housing 1410 under the guidance of the filler 1430, while being constrained from randomly moving by the filler 1430 fixed to the housing 1410.

An electronic device 1400 may preferably implement a waterproof structure since the key button assembly 1440 disposed outside the housing 1410 is electrically connected to the substrate 1480 inside the housing 1410 without having to pass through an additional opening portion of the housing 1410 prepared for electrically connection. For example, such a structure may prevent moisture from permeating into the housing 1410 even if the moisture is introduced through the through-hole 1403 of the display 1420.

Figure 15:
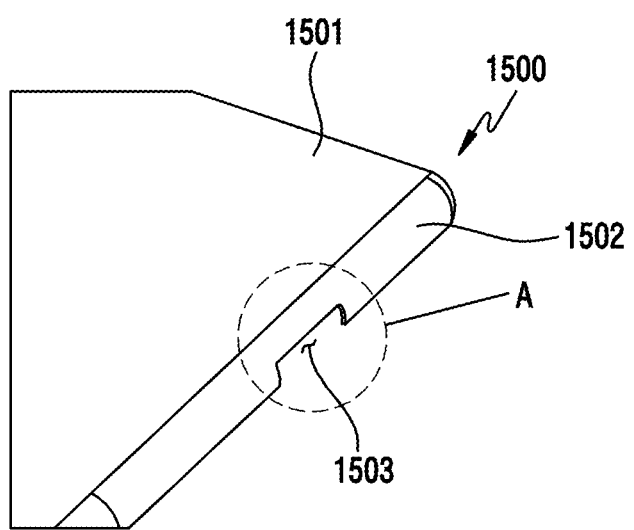
FIG. 15 illustrates a shape of a display module and a structure of a data line according to embodiments of the present disclosure.

FIG. 15 illustrates a shape of a display module and a structure of a data line according to an embodiment of the present disclosure.

A display module 1500 of FIG. 15 may include the display module 420 of FIG. 4, the display module 620 of FIG. 6, the display module 1020 of FIG. 10, the display module 1220 of FIG. 12A, the display module 1320 of FIG. 13D, or the display module 1420 of FIG. 14, or may include another embodiment of the display module.

Referring to FIG. 15, the display module 1500 may include a flat area 1501 and a bending area 1502 extended to be bent from the flat area 1501 with a specific curvature in a direction of a lateral surface. An opening 1503 may be formed in the bending area 1502 such that a key button of the aforementioned key button assembly is exposed to the outside of the electronic device through the bending area 1502. The opening 1503 may be formed in a recess shape which is recessed in an inner direction from an end portion of the bending area 1502 of the display module 1500.

Figure 16:
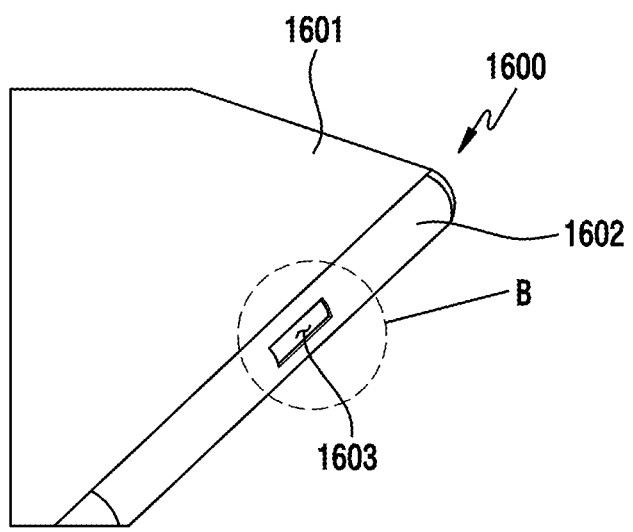
FIG. 16 illustrates a shape of a display module and a structure of a data line according to embodiments of the present disclosure.

FIG. 16 illustrates a shape of a display module and a structure of a data line according to an embodiment of the present disclosure.

A display module 1600 of FIG. 16 may include the display module 420 of FIG. 4, the display module 620 of FIG. 6, the display module 1020 of FIG. 10, the display module 1220 of FIG. 12A, the display module 1320 of FIG. 13D, or the display module 1420 of FIG. 14, or may include another embodiment of the display module.

Referring to FIG. 16, a display module 1600 may include a flat area 1601 and a bending area 1602 extended to be bent from the flat area 1601 with a specific curvature in a direction of a lateral surface. A through-hole 1603 may be formed in the bending area 1602 such that a key button of the aforementioned key button assembly is exposed to the outside of the electronic device through the bending area 1602. The through-hole 1603 may be formed to penetrate a proper place of the bending area 1602 of the display module 1600.

FIG. 17 to FIG. 19C illustrate a structure of a key pad assembly installed to an electronic device by penetrating a bended display according to an embodiment of the present disclosure.

As described above, a key button assembly exposed through a bending area of a display may include a pressure responsive structure or a physical pressing structure based on a dome key. Other various key button structures will be described below.

Although a housing structure of an electronic device or a configuration of a filler applied to a bending area is excluded in the description of the drawings described below, it is apparent to those ordinarily skilled in the art that the housing structure and the filler configuration can be added.

Figure 17:
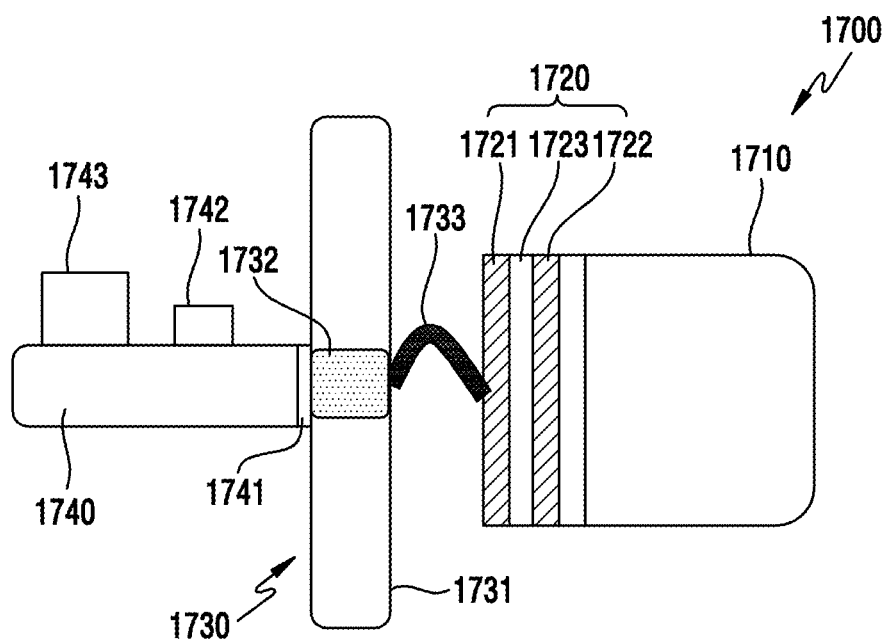
FIG. 17 to FIG. 19C illustrate a structure of a key pad assembly installed to an electronic device by penetrating a bended display according to embodiments of the present disclosure.

FIG. 17 illustrates a structure of a key button assembly for detecting an input of a key button by using a change in capacitance.

Referring to FIG. 17, a key button assembly 1700 may include a sensor layer 1720 at an end portion, and may include a key button 1710 disposed outside a housing 1730, the housing 1730 including a conductive member 1732 electrically connected to the sensor layer 1720, and a substrate 1740 disposed inside the housing 1730.

According to an embodiment of the present disclosure, the sensor layer 1720 may include a first conductive layer 1721 and a second conductive layer 1722 spaced apart from the first conductive layer 1721 by means of a dielectric layer 1723. The first conductive layer 1721 may maintain a state of being electrically connected to the conductive member 1732 of the housing 1730. The conductive member 1732 may maintain a state of being insulated from surroundings by means of a neighboring non-conductive member 1731. The first conductive layer 1721 may be electrically connected by maintaining a state of being physically connected to a first connection node 1733 fixed to the conductive member 1732, for example, from the outside of the housing 1730. The second conductive layer 1722 may be grounded. The substrate 1740 may be electrically connected to be in contact with the conductive member 1732 from the inside of the housing 1730 by means of a second connection node 1741. The first connection node 1733 may maintain a state of being electrically connected to the substrate 1740 through the second connection node 1741 with the conductive member 1732 of the housing 1730.

The substrate 1740 may include at least one processor 1743 and a detection circuit 1742. A distance between the first conductive layer 1721 and a second conductive layer 1722 is changed when the key button 1710 is pressed by more than a specific pressure, and the detection circuit 1742 may detect a change in capacitance accumulated therebetween. The processor 1743 may control the electronic device to perform a corresponding function on the basis of a detection signal provided from the detection circuit 1742.

Figure 18:
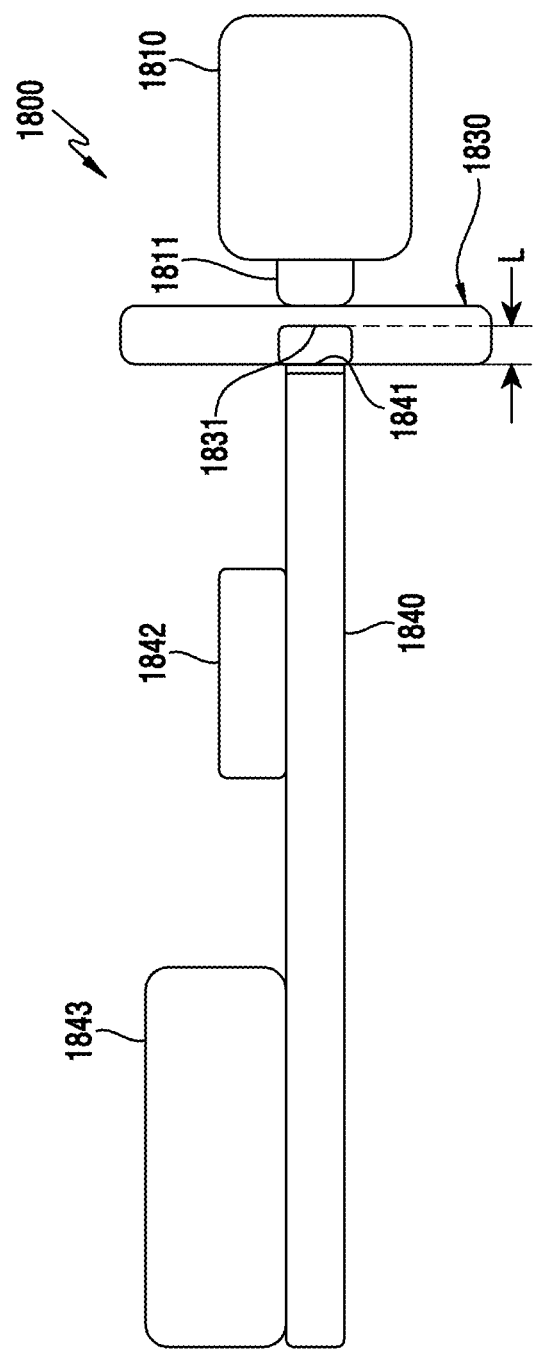

FIG. 18 illustrates a structure of a key button assembly for detecting an input of a key button by using an electromagnetic induction type.

Referring to FIG. 18, a key button assembly 1800 may include a conductive housing 1830 of which at least one region is formed of a conductive member, a key button 1810 disposed to the outside of the conductive housing 1830 and including a pressing protrusion 1811 formed at an end portion to be in contact with an outer surface, a substrate 1840 disposed inside the housing 1830, and a coil member 1841 disposed to the substrate 1840 and generating a specific oscillation frequency depending on strength of supplied current. The coil member 1840 may be replaced with a pattern formed on the substrate 1840.

According to an embodiment of the present disclosure, the housing 1830 may include a pressing portion 1831 formed at a position corresponding to the pressing protrusion 1811. The pressing portion 1831 is formed to have a thinner thickness than the housing 1830 so as to be spaced apart by a specific interval L from the coil member 1841 disposed to the substrate 1840, and thus a shape thereof may be changed by a pressure of the pressing protrusion 1811 of the key button 1810.

The substrate 1840 may include at least one processor 1843 and a detection circuit 1842. An oscillation frequency generated in the coil member 1841 is changed in shape when the pressing protrusion 1811 presses the pressing portion 1831 of the housing 1830 due to pressing of the key button 1810, and thus an operational frequency band generated in the coil member 1841 may be changed. The detection circuit 1842 may detect the changed oscillation frequency of the coil member 1841. The processor 1843 may control the electronic device to perform a corresponding function on the basis of a detection signal provided from the detection circuit 1842.

Figure 19A:
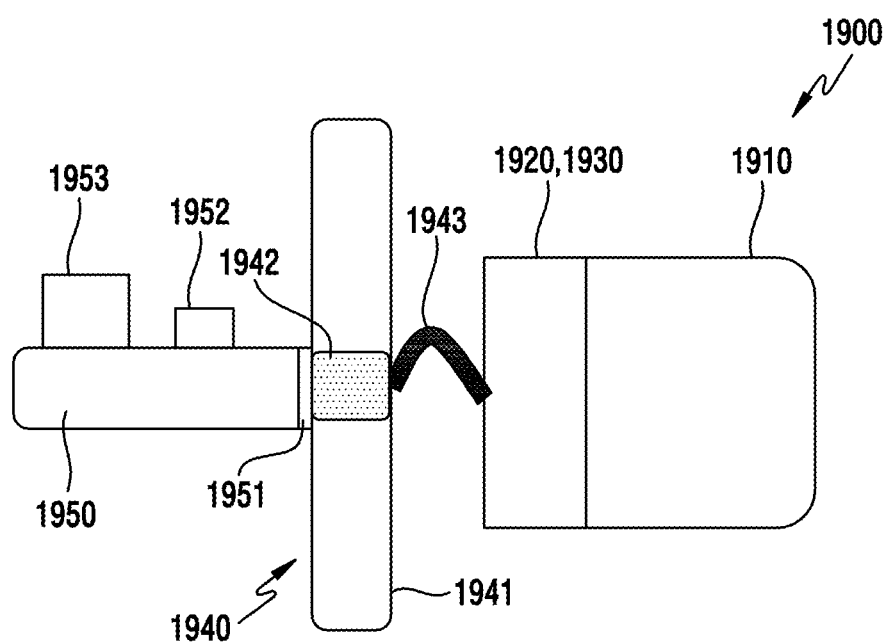
Figure 19B:
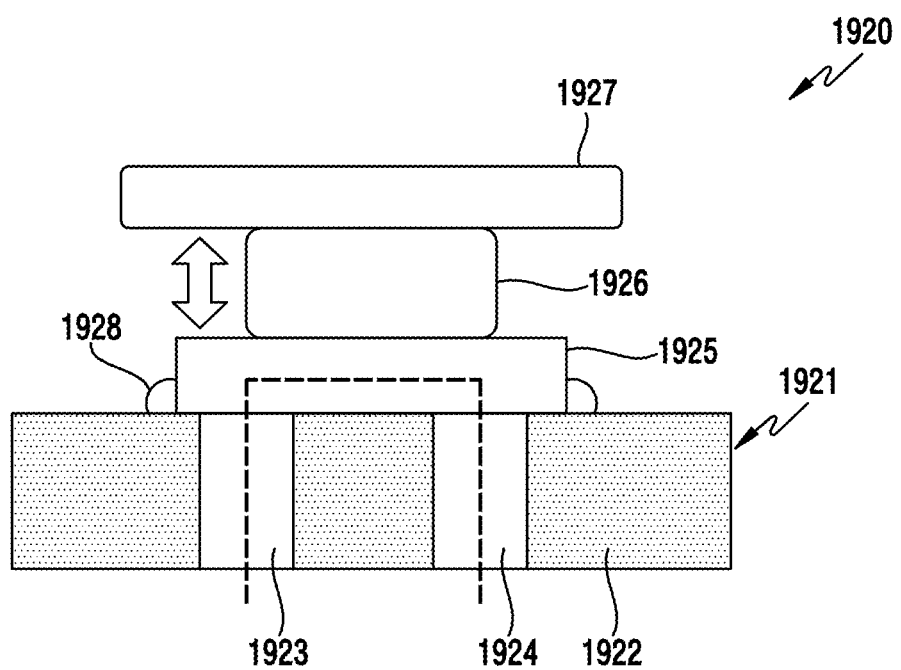
Figure 19C:
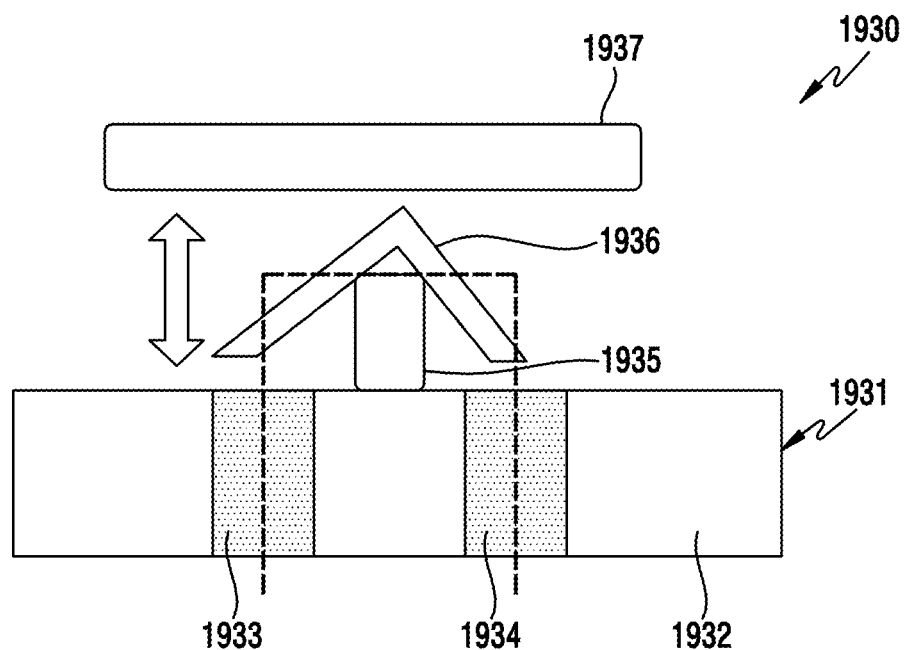

FIG. 19A to FIG. 19C illustrate a structure of a key button assembly for detecting an input of a key button by using a piezoelectric type.

Referring to FIG. 19A, a key button assembly 1900 may include sensor layers 1920 and 1930 at an end portion, and may include a key button 1910 disposed to the outside of a housing 1940, the housing 1940 including a conductive member 1942 electrically connected to the sensor layers 1920 and 1930, and a substrate 1950 disposed inside the housing 1940.

According to an embodiment of the present disclosure, the sensor layers 1920 and 1930 may maintain a state of being electrically connected to the conductive member 1942 of the housing 1940. The sensor layers 1920 and 1930 may be electrically connected by maintaining a state of being physically connected to a first connection node 1943 fixed to the conductive member 1942 from the outside of the housing

1940. The substrate 1950 may be electrically connected to be in contact with the conductive member 1942 from the inside of the housing 1940 by means of a second connection node 1951. The first connection node 1943 may maintain a state of being electrically connected to the substrate 1950 through the second connection node 1951 with the conductive member 1942 of the housing 1940.

According to an embodiment of the present disclosure, the substrate 1950 may include at least one processor 1953 and a detection circuit 1952. When the key button 1910 is pressed by more than a specific pressure, a piezoelectric member (e.g., a conductive polymer, a piezoelectric rubber, etc.) of the sensor layers 1920 and 1930 to be described later is conducted, and thus this can be detected. The processor 1953 may control the electronic device to perform a corresponding function on the basis of a detection signal provided from the detection circuit 1952.

Referring to FIG. 19B, the sensor layer 1920 may include a key button 1927 supported by a supporting piece 1926, a piezoelectric member 1925 (e.g., a conductive polymer, a piezoelectric rubber, etc.) pressed by the supporting piece 1926, and a conducting layer 1921 including one pair of conductive members 1923 and 1924 which are conducted depending on a conduction state of the piezoelectric member 1925 and disposed to be spaced apart in a state of being mutually insulated by means of a non-conductive member 1922. The conducting layer 1921 may be replaced as one element of the housing, and may be replaced as at least one element of the aforementioned filler.

According to an embodiment of the present disclosure, when the key button 1927 is not pressed, the piezoelectric member 1925 may operate with a non-conductive material, and in this case, one pair of the conductive members 1923 and 1924 of the conducting layer 1921 may maintain an electrically insulated state. The key button 1927 is pressed with a specific pressure, and when the pressure is delivered to the piezoelectric member 1925, the piezoelectric member 1925 may be changed to a conductive material. One pair of the conductive members 1923 and 1924 of the conducting layer 1921 may be electrically connected to have a conducting path illustrated as a dotted line by means of the piezoelectric member 1925 changed to the conductive material by the pressure.

Referring to FIG. 19C, the sensor layer 1930 may include a key button 1937, a conductive pressing piece 1936 pressed by the key button 1937 and provided with a restoring force by means of a specific elastic member 1935, and a conducting layer 1931 including one pair of pressing members 1933 and 1934 (e.g., a conductive polymer, a pressing rubber, etc.) disposed to be spaced apart from each other by a non-conductive member 1932. The conducting layer 1931 may be replaced as one constitutional element of the housing, and may be replaced as at least one element of the aforementioned filler.

According to an embodiment of the present disclosure, when the key button 1937 is not pressed, one pair of the piezoelectric members 1933 and 1934 may operate with a non-conductive material. In this case, a state of being electrically insulated from each other may be maintained. When a pressure is delivered to each of the piezoelectric members 1933 and 1934 by means of the conductive pressing piece 1936 depending on pressure, the piezoelectric members 1933 and 1934 may be changed to a conductive material. One pair of the piezoelectric members 1933 and 1934 of the conducting layer 1931 may be changed to a conductive material by a mutual contact and pressure of the conductive pressing piece 1936, and may be electrically connected to have a conducting path illustrated as a dotted line.

According to an embodiment of the present disclosure, since an electronic component (e.g., a key button) is exposed through a display, excellent feeling of aesthetics and feeling of grip can be provided through a bended display while increasing convenience of use of the key button based on user experience. In addition, an improved assembling property can be provided between the housing and the bended display to which the electronic component is applied.

According to an embodiment of the present disclosure, an electronic device includes a housing including a first surface, a second surface facing the first surface in a spaced apart manner, and a lateral surface surrounding a space between the first surface and the second surface, a display mounted to the housing and including a flat area substantially corresponding to the first surface and a bending area extended from the flat area in a direction of the lateral surface, a filler disposed between the housing and the bending area of the display, at least one electronic component which is installed to the filler and of which one part is exposed to the outside by penetrating at least one region of the bending area of the display, a detection circuit disposed inside the housing and electrically connected to the electronic component to detect an operation of the electronic component, and at least one processor operatively coupled to the detection circuit and the display to provide control to perform a corresponding function of the electronic device on the basis of a provided detection signal.

According to an embodiment of the present disclosure, the filler may be formed in a shape corresponding to an inner surface of the bending area, and may be disposed to be adjacent to the inner surface of the bending area.

According to an embodiment of the present disclosure, the bending area may be extended to up to at least one region of the second surface of the housing through the lateral surface or at least one region of the lateral surface of the housing.

According to an embodiment of the present disclosure, the bending area may be formed in a curved shape in a concaved manner while having a specific curvature to the outside.

According to an embodiment of the present disclosure, the housing may be formed by a double injection process using a non-conductive member and a conductive member, and may include a conductive connection region formed to be insulated from a neighboring conductive member due to the non-conductive member. The at least one electronic component may be electrically connected to the connection area from the outside of the housing.

According to an embodiment of the present disclosure, the conductive connection region may be electrically connected to the detection circuit from the inside of the housing.

According to an embodiment of the present disclosure, the at least one electronic component may be installed inside the bending area of the display through the filler before the display is mounted to the housing.

According to an embodiment of the present disclosure, the at least one electronic component may be in contact with a conductive connection region of the housing, when the display is assembled to the housing.

According to an embodiment of the present disclosure, the at least one electronic component may include at least one exposing node. At least one connection node fixed to the outside of the housing in a protruding manner may be included in the conductive connection region. The exposing node of the at least one electronic component may be physically in contact with the connection node, when the display is assembled to the housing.

According to an embodiment of the present disclosure, the electronic device may further include a waterproof member disposed between the conductive connection region and the filler in a manner of surrounding the conductive connection region.

According to an embodiment of the present disclosure, the display may include a window and a display module disposed to a rear surface of the window.

According to an embodiment of the present disclosure, an exposed part of the at least one electronic component may be exposed by penetrating the window through an opening or through-hole formed in at least one part of a region corresponding to the bending area of the display module.

According to an embodiment of the present disclosure, the electronic device may include at least one seal member disposed between the display and the first surface of the housing to avoid permeation of water introduced from a portion where the at least one electronic component is exposed.

According to an embodiment of the present disclosure, the at least one electronic component may include at least one of a key button assembly, a speaker device, a microphone device, a camera device, various sensor devices, an interface connector device, a flash device, and an external card storage device.

According to an embodiment of the present disclosure, the at least one electronic component may include a key button assembly. The key button assembly may include at least one structure among a pressure responsive structure, a physical pressing structure including a dome key, a structure of detecting a change in capacitance, an electromagnetic induction type structure, and a structure of using selective conduction based on a piezoelectric member.

According to an embodiment of the present disclosure, an electronic device includes a housing including a first surface, a second surface facing the first surface in a spaced apart manner, and a lateral surface surrounding a space between the first surface and the second surface, a display mounted to the housing and including a flat area substantially corresponding to the first surface and a bending area extended from the flat area in a direction of the lateral surface, a filler disposed between the housing and the bending area of the display, a key button assembly which is installed to the filler and of which one part is exposed to the outside by penetrating at least one region of the bending area of the display, a detection circuit disposed inside the housing and electrically connected to the key button assembly to detect a key input, and at least one processor operatively coupled to the detection circuit and the display to provide control to perform a corresponding function of the electronic device on the basis of a provided detection signal.

According to an embodiment of the present disclosure, the key button assembly may include at least one exposing node exposed to the outside. At least one connection node fixed to the outside of the housing in a protruding manner may be included in the conductive connection region. The exposing node of the key button assembly may be physically in contact with the connection node, when the display is assembled to the housing.

According to an embodiment of the present disclosure, the electronic device may further include a waterproof member disposed between the conductive connection region and the filler in a manner of surrounding the conductive connection region.

According to an embodiment of the present disclosure, an exposed key button region of the key button assembly may be exposed by penetrating the window through an opening or through-hole formed in at least one part of a region corresponding to the bending area of the display module.

According to an embodiment of the present disclosure, the key button assembly may include at least one structure among a pressure responsive structure, a physical pressing structure including a dome key, a structure of detecting a change in capacitance, an electromagnetic induction type structure, and a structure of using selective conduction based on a piezoelectric member.

Each element described in the present disclosure may consist of one or more components, and names thereof may vary depending on a type of an electronic device. The electronic device may include at least one of the elements described in the present disclosure. Some of the elements may be omitted, or additional other elements may be further included. Further, some of the elements of the electronic device according to embodiments of the present disclosure may be combined and constructed as one entity, so as to equally perform functions of corresponding elements before combination.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. An electronic device comprising:
   a housing comprising a first surface, a second surface opposite to the first surface, and a lateral surface surrounding a space between the first surface and the second surface;
   a display mounted to the housing and comprising a flat area substantially corresponding to the first surface and a bending area extended from the flat area in a direction of the lateral surface;
   a filler disposed between the housing and the bending area of the display;
   at least one electronic component which is installed to the filler and of which one part is exposed to the outside of the housing by penetrating at least one region of the bending area of the display;
   a detection circuit disposed inside the housing and electrically connected to the electronic component to detect an operation of the electronic component; and
   at least one processor operatively coupled to the detection circuit and the display to provide control to perform a corresponding function of the electronic device on the basis of a provided detection signal.

2. The electronic device of claim 1, wherein the filler is formed in a shape corresponding to an inner surface of the bending area, and is disposed to be adjacent to the inner surface of the bending area.

3. The electronic device of claim 1, wherein the bending area extends up to at least one region of the second surface of the housing through the lateral surface or at least one region of the lateral surface of the housing.

4. The electronic device of claim 1, wherein the bending area is formed in a curved shape in a concave manner while having a specific curvature to the outside.

5. The electronic device of claim 1,
   wherein the housing is formed by a double injection molding process using a non-conductive member and a conductive member, and comprises a conductive connection region formed to be insulated from a neighboring conductive member due to the non-conductive member, and wherein the at least one electronic component is electrically connected to the connection area from the outside of the housing.

6. The electronic device of claim 5, wherein the conductive connection region is electrically connected to the detection circuit from the inside of the housing.

7. The electronic device of claim 5, wherein the at least one electronic component is installed inside the bending area of the display through the filler before the display is mounted to the housing.

8. The electronic device of claim 7, wherein the at least one electronic component is in contact with the conductive connection region of the housing, when the display is assembled to the housing.

9. The electronic device of claim 8,
wherein the at least one electronic component comprises at least one exposing node,
wherein at least one connection node fixed to the outside of the housing in a protruding manner is comprised in the conductive connection region, and
wherein the exposing node of the at least one electronic component is physically in contact with the connection node, when the display is assembled to the housing.

10. The electronic device of claim 9, further comprising a waterproof member disposed between the conductive connection region and the filler in a manner of surrounding the conductive connection region.

11. The electronic device of claim 1, wherein the display comprises a window and a display module disposed to a rear surface of the window.

12. The electronic device of claim 11, wherein an exposed part of the at least one electronic component is exposed by penetrating the window through an opening or through-hole formed in at least one part of a region corresponding to the bending area of the display.

13. The electronic device of claim 1, wherein the electronic device further comprises at least one seal member disposed between the display and the first surface of the housing to avoid permeation of water introduced from a portion where the at least one electronic component is exposed.

14. The electronic device of claim 1, wherein the at least one electronic component comprises at least one of a key button assembly, a speaker device, a microphone device, a camera device, various sensor devices, an interface connector device, a flash device, and an external card storage device.

15. The electronic device of claim 1,
wherein the at least one electronic component comprises a key button assembly, and
wherein the key button assembly comprises at least one structure among a pressure responsive structure, a physical pressing structure comprising a dome key, a structure of detecting a change in capacitance, an electromagnetic induction type structure, and a structure of using selective conduction based on a piezoelectric member.

16. An electronic device comprising:
a housing comprising a first surface, a second surface opposite to the first surface, and a lateral surface surrounding a space between the first surface and the second surface;
a display mounted to the housing and comprising a flat area substantially corresponding to the first surface and a bending area extended from the flat area in a direction of the lateral surface;
a filler disposed between the housing and the bending area of the display;
a key button assembly which is installed to the filler and of which one part is exposed to the outside of the housing by penetrating at least one region of the bending area of the display;
a detection circuit disposed inside the housing and electrically connected to the key button assembly to detect a key input; and
at least one processor operatively coupled to the detection circuit and the display to provide control to perform a corresponding function of the electronic device on the basis of a provided detection signal.

17. The electronic device of claim 16,
wherein the key button assembly comprises at least one exposing node exposed to the outside,
wherein at least one connection node fixed to the outside of the housing in a protruding manner is comprised in a conductive connection region, and
wherein the exposing node of the key button assembly is physically in contact with the connection node, when the display is assembled to the housing.

18. The electronic device of claim 17, further comprising a waterproof member disposed between the conductive connection region and the filler in a manner of surrounding the conductive connection region.

19. The electronic device of claim 16, wherein an exposed key button region of the key button assembly is exposed by penetrating a window through an opening or through-hole formed in at least one part of a region corresponding to the bending area of the display.

20. The electronic device of claim 16, wherein the key button assembly comprises at least one structure among a pressure responsive structure, a physical pressing structure comprising a dome key, a structure of detecting a change in capacitance, an electromagnetic induction type structure, and a structure of using selective conduction based on a piezoelectric member.

* * * * *